United States Patent
Inoue et al.

(10) Patent No.: US 10,432,208 B2
(45) Date of Patent: Oct. 1, 2019

(54) D/A CONVERTER, AND A/D CONVERTER

(71) Applicants: Fumihiro Inoue, Tokyo (JP); Akira Mogi, Tokyo (JP)

(72) Inventors: Fumihiro Inoue, Tokyo (JP); Akira Mogi, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/077,539

(22) PCT Filed: Dec. 15, 2016

(86) PCT No.: PCT/JP2016/087391
§ 371 (c)(1),
(2) Date: Aug. 13, 2018

(87) PCT Pub. No.: WO2017/149902
PCT Pub. Date: Sep. 8, 2017

(65) Prior Publication Data
US 2019/0058482 A1 Feb. 21, 2019

(30) Foreign Application Priority Data
Mar. 3, 2016 (JP) .................. 2016-040764

(51) Int. Cl.
*H03M 1/06* (2006.01)
*H03M 1/46* (2006.01)
(Continued)

(52) U.S. Cl.
CPC ......... *H03M 1/066* (2013.01); *H03M 1/0663* (2013.01); *H03M 1/46* (2013.01); *H03M 1/687* (2013.01); *H03M 1/747* (2013.01)

(58) Field of Classification Search
CPC .... H03M 1/066; H03M 1/0663; H03M 1/747; H03M 1/46; H03M 1/687
(Continued)

(56) References Cited

U.S. PATENT DOCUMENTS 5,539,403 A * 7/1996 Tani .................... H03M 1/0663
341/144
5,995,031 A * 11/1999 Okuda ................ H03M 1/0663
341/143

(Continued)

FOREIGN PATENT DOCUMENTS

GB 2350950 12/2000
JP H11-031969 2/1999
(Continued)

OTHER PUBLICATIONS

International Search Report for PCT/JP2016/087391 dated Mar. 7, 2017.
(Continued)

*Primary Examiner* — Lam T Mai
(74) *Attorney, Agent, or Firm* — IPUSA, PLLC

(57) ABSTRACT

A D/A converter for converting a digital signal with a predetermined number of bits to an analog signal, the D/A converter includes a plurality of component groups that include a plurality of components included in the D/A converter and are connected to an output unit for outputting the analog signal in a predetermined order; and a start position change unit that changes a start position within the plurality of the component groups used for generating a single analog signal by using a predefined shift pattern when generating the single analog signal corresponding to the digital signal.

16 Claims, 36 Drawing Sheets

(51) Int. Cl.
    *H03M 1/68*     (2006.01)
    *H03M 1/74*     (2006.01)

(58) Field of Classification Search
    USPC .......................................... 341/130–135, 144
    See application file for complete search history.

(56) References Cited

U.S. PATENT DOCUMENTS

| | | | |
|---|---|---|---|
| 6,950,049 B2 | 9/2005 | Brooks et al. | |
| 9,484,947 B1* | 11/2016 | Nguyen | H03M 1/70 |
| 2005/0285479 A1* | 12/2005 | Machida | G02B 7/10 |
| | | | 310/328 |
| 2006/0007027 A1* | 1/2006 | Ishizuka | H03M 1/067 |
| | | | 341/50 |

FOREIGN PATENT DOCUMENTS

| | | |
|---|---|---|
| JP | 2005-197995 | 7/2005 |
| JP | 2006-019988 | 1/2006 |
| JP | 2010-245765 | 10/2010 |

OTHER PUBLICATIONS

Williams L A ED—Wuorinen J H, "An audio DAC with 90 dB linearity using MOS to metal-metal charge transfer", Solid-State Circuits Conference, 1998. Digest of Technical Papers. 199 8 IEEE International San Francisco, CA, USA Feb. 5-7, 1998, New York, NY, USA, IEEE, US, Feb. 5, 1998 (Feb. 5, 1998), pp. 58-59, XP032382543.

Adams R et al, "A 113 dB SNR oversampling DAC with segmented noise-shaped scrambling", Solid-State Circuits Conference, 1998. Digest of Technical Papers. 1998 IEEE International San Francisco, CA, USA Feb. 5, 1998, New York, NY, USA, IEEE, US, Feb. 5, 1998 (Feb. 5, 1998), pp. 62-63, XP032382545.

Kok Lim Chan et al, "Segmented Dynamic Element Matching for High-Resolution Digital-to-Analog Conversion", IEEE Transactions on Circuits and Systems I: Regular Papers, IEEE, US, vol. 55, No. 11, Dec. 2008 (Dec. 2008), pp. 3383-3392, XP011333344.

Extended European search report for European Patent Application No. 16892736.6 dated Feb. 20, 2019.

* cited by examiner

FIG.3A

| SHIFT AMOUNT 1 →WITHOUT SELECTION BIAS | | ORDER OF COMPONENT GROUPS | | | | | | | |
|---|---|---|---|---|---|---|---|---|---|
| | | (1) | (2) | (3) | (4) | (5) | (6) | (7) | (8) |
| NUMBER OF DAC OUTPUTS | FIRST TIME | DAC1 | DAC2 | DAC3 | DAC4 | DAC5 | DAC6 | DAC7 | DAC8 |
| | SECOND TIME | DAC2 | DAC3 | DAC4 | DAC5 | DAC6 | DAC7 | DAC8 | DAC1 |
| | THIRD TIME | DAC3 | DAC4 | DAC5 | DAC6 | DAC7 | DAC8 | DAC1 | DAC2 |
| | FOURTH TIME | DAC4 | DAC5 | DAC6 | DAC7 | DAC8 | DAC1 | DAC2 | DAC3 |
| | FIFTH TIME | DAC5 | DAC6 | DAC7 | DAC8 | DAC1 | DAC2 | DAC3 | DAC4 |
| | SIXTH TIME | DAC6 | DAC7 | DAC8 | DAC1 | DAC2 | DAC3 | DAC4 | DAC5 |
| | SEVENTH TIME | DAC7 | DAC8 | DAC1 | DAC2 | DAC3 | DAC4 | DAC5 | DAC6 |
| | EIGHTH TIME | DAC8 | DAC1 | DAC2 | DAC3 | DAC4 | DAC5 | DAC6 | DAC7 |

FIG.3B

| SHIFT AMOUNT 2 →WITH SELECTION BIAS | | ORDER OF COMPONENT GROUPS | | | | | | | |
|---|---|---|---|---|---|---|---|---|---|
| | | (1) | (2) | (3) | (4) | (5) | (6) | (7) | (8) |
| NUMBER OF DAC OUTPUTS | FIRST TIME | DAC1 | DAC2 | DAC3 | DAC4 | DAC5 | DAC6 | DAC7 | DAC8 |
| | SECOND TIME | DAC3 | DAC4 | DAC5 | DAC6 | DAC7 | DAC8 | DAC1 | DAC2 |
| | THIRD TIME | DAC5 | DAC6 | DAC7 | DAC8 | DAC1 | DAC2 | DAC3 | DAC4 |
| | FOURTH TIME | DAC7 | DAC8 | DAC1 | DAC2 | DAC3 | DAC4 | DAC5 | DAC6 |
| | FIFTH TIME | DAC1 | DAC2 | DAC3 | DAC4 | DAC5 | DAC6 | DAC7 | DAC8 |
| | SIXTH TIME | DAC3 | DAC4 | DAC5 | DAC6 | DAC7 | DAC8 | DAC1 | DAC2 |
| | SEVENTH TIME | DAC5 | DAC6 | DAC7 | DAC8 | DAC1 | DAC2 | DAC3 | DAC4 |
| | EIGHTH TIME | DAC7 | DAC8 | DAC1 | DAC2 | DAC3 | DAC4 | DAC5 | DAC6 |

FIG.3C

| SHIFT AMOUNT 3 →WITHOUT SELECTION BIAS | | ORDER OF COMPONENT GROUPS | | | | | | | |
|---|---|---|---|---|---|---|---|---|---|
| | | (1) | (2) | (3) | (4) | (5) | (6) | (7) | (8) |
| NUMBER OF DAC OUTPUTS | FIRST TIME | DAC1 | DAC2 | DAC3 | DAC4 | DAC5 | DAC6 | DAC7 | DAC8 |
| | SECOND TIME | DAC4 | DAC5 | DAC6 | DAC7 | DAC8 | DAC1 | DAC2 | DAC3 |
| | THIRD TIME | DAC7 | DAC8 | DAC1 | DAC2 | DAC3 | DAC4 | DAC5 | DAC6 |
| | FOURTH TIME | DAC2 | DAC3 | DAC4 | DAC5 | DAC6 | DAC7 | DAC8 | DAC1 |
| | FIFTH TIME | DAC5 | DAC6 | DAC7 | DAC8 | DAC1 | DAC2 | DAC3 | DAC4 |
| | SIXTH TIME | DAC8 | DAC1 | DAC2 | DAC3 | DAC4 | DAC5 | DAC6 | DAC7 |
| | SEVENTH TIME | DAC3 | DAC4 | DAC5 | DAC6 | DAC7 | DAC8 | DAC1 | DAC2 |
| | EIGHTH TIME | DAC6 | DAC7 | DAC8 | DAC1 | DAC2 | DAC3 | DAC4 | DAC5 |

FIG.3D

| SHIFT AMOUNT 4 →WITH SELECTION BIAS | | ORDER OF COMPONENT GROUPS | | | | | | | |
|---|---|---|---|---|---|---|---|---|---|
| | | (1) | (2) | (3) | (4) | (5) | (6) | (7) | (8) |
| NUMBER OF DAC OUTPUTS | FIRST TIME | DAC1 | DAC2 | DAC3 | DAC4 | DAC5 | DAC6 | DAC7 | DAC8 |
| | SECOND TIME | DAC5 | DAC6 | DAC7 | DAC8 | DAC1 | DAC2 | DAC3 | DAC4 |
| | THIRD TIME | DAC1 | DAC2 | DAC3 | DAC4 | DAC5 | DAC6 | DAC7 | DAC8 |
| | FOURTH TIME | DAC5 | DAC6 | DAC7 | DAC8 | DAC1 | DAC2 | DAC3 | DAC4 |
| | FIFTH TIME | DAC1 | DAC2 | DAC3 | DAC4 | DAC5 | DAC6 | DAC7 | DAC8 |
| | SIXTH TIME | DAC5 | DAC6 | DAC7 | DAC8 | DAC1 | DAC2 | DAC3 | DAC4 |
| | SEVENTH TIME | DAC1 | DAC2 | DAC3 | DAC4 | DAC5 | DAC6 | DAC7 | DAC8 |
| | EIGHTH TIME | DAC5 | DAC6 | DAC7 | DAC8 | DAC1 | DAC2 | DAC3 | DAC4 |

FIG.4A

| SHIFT AMOUNT 5 →WITHOUT SELECTION BIAS | | ORDER OF COMPONENT GROUPS | | | | | | | |
|---|---|---|---|---|---|---|---|---|---|
| | | (1) | (2) | (3) | (4) | (5) | (6) | (7) | (8) |
| NUMBER OF DAC OUTPUTS | FIRST TIME | DAC1 | DAC2 | DAC3 | DAC4 | DAC5 | DAC6 | DAC7 | DAC8 |
| | SECOND TIME | DAC6 | DAC7 | DAC8 | DAC1 | DAC2 | DAC3 | DAC4 | DAC5 |
| | THIRD TIME | DAC3 | DAC4 | DAC5 | DAC6 | DAC7 | DAC8 | DAC1 | DAC2 |
| | FOURTH TIME | DAC8 | DAC1 | DAC2 | DAC3 | DAC4 | DAC5 | DAC6 | DAC7 |
| | FIFTH TIME | DAC5 | DAC6 | DAC7 | DAC8 | DAC1 | DAC2 | DAC3 | DAC4 |
| | SIXTH TIME | DAC2 | DAC3 | DAC4 | DAC5 | DAC6 | DAC7 | DAC8 | DAC1 |
| | SEVENTH TIME | DAC7 | DAC8 | DAC1 | DAC2 | DAC3 | DAC4 | DAC5 | DAC6 |
| | EIGHTH TIME | DAC4 | DAC5 | DAC6 | DAC7 | DAC8 | DAC1 | DAC2 | DAC3 |

FIG.4B

| SHIFT AMOUNT 6 →WITH SELECTION BIAS | | ORDER OF COMPONENT GROUPS | | | | | | | |
|---|---|---|---|---|---|---|---|---|---|
| | | (1) | (2) | (3) | (4) | (5) | (6) | (7) | (8) |
| NUMBER OF DAC OUTPUTS | FIRST TIME | DAC1 | DAC2 | DAC3 | DAC4 | DAC5 | DAC6 | DAC7 | DAC8 |
| | SECOND TIME | DAC7 | DAC8 | DAC1 | DAC2 | DAC3 | DAC4 | DAC5 | DAC6 |
| | THIRD TIME | DAC5 | DAC6 | DAC7 | DAC8 | DAC1 | DAC2 | DAC3 | DAC4 |
| | FOURTH TIME | DAC3 | DAC4 | DAC5 | DAC6 | DAC7 | DAC8 | DAC1 | DAC2 |
| | FIFTH TIME | DAC1 | DAC2 | DAC3 | DAC4 | DAC5 | DAC6 | DAC7 | DAC8 |
| | SIXTH TIME | DAC7 | DAC8 | DAC1 | DAC2 | DAC3 | DAC4 | DAC5 | DAC6 |
| | SEVENTH TIME | DAC5 | DAC6 | DAC7 | DAC8 | DAC1 | DAC2 | DAC3 | DAC4 |
| | EIGHTH TIME | DAC3 | DAC4 | DAC5 | DAC6 | DAC7 | DAC8 | DAC1 | DAC2 |

FIG.4C

| SHIFT AMOUNT 7 →WITHOUT SELECTION BIAS | | ORDER OF COMPONENT GROUPS | | | | | | | |
|---|---|---|---|---|---|---|---|---|---|
| | | (1) | (2) | (3) | (4) | (5) | (6) | (7) | (8) |
| NUMBER OF DAC OUTPUTS | FIRST TIME | DAC1 | DAC2 | DAC3 | DAC4 | DAC5 | DAC6 | DAC7 | DAC8 |
| | SECOND TIME | DAC8 | DAC1 | DAC2 | DAC3 | DAC4 | DAC5 | DAC6 | DAC7 |
| | THIRD TIME | DAC7 | DAC8 | DAC1 | DAC2 | DAC3 | DAC4 | DAC5 | DAC6 |
| | FOURTH TIME | DAC6 | DAC7 | DAC8 | DAC1 | DAC2 | DAC3 | DAC4 | DAC5 |
| | FIFTH TIME | DAC5 | DAC6 | DAC7 | DAC8 | DAC1 | DAC2 | DAC3 | DAC4 |
| | SIXTH TIME | DAC4 | DAC5 | DAC6 | DAC7 | DAC8 | DAC1 | DAC2 | DAC3 |
| | SEVENTH TIME | DAC3 | DAC4 | DAC5 | DAC6 | DAC7 | DAC8 | DAC1 | DAC2 |
| | EIGHTH TIME | DAC2 | DAC3 | DAC4 | DAC5 | DAC6 | DAC7 | DAC8 | DAC1 |

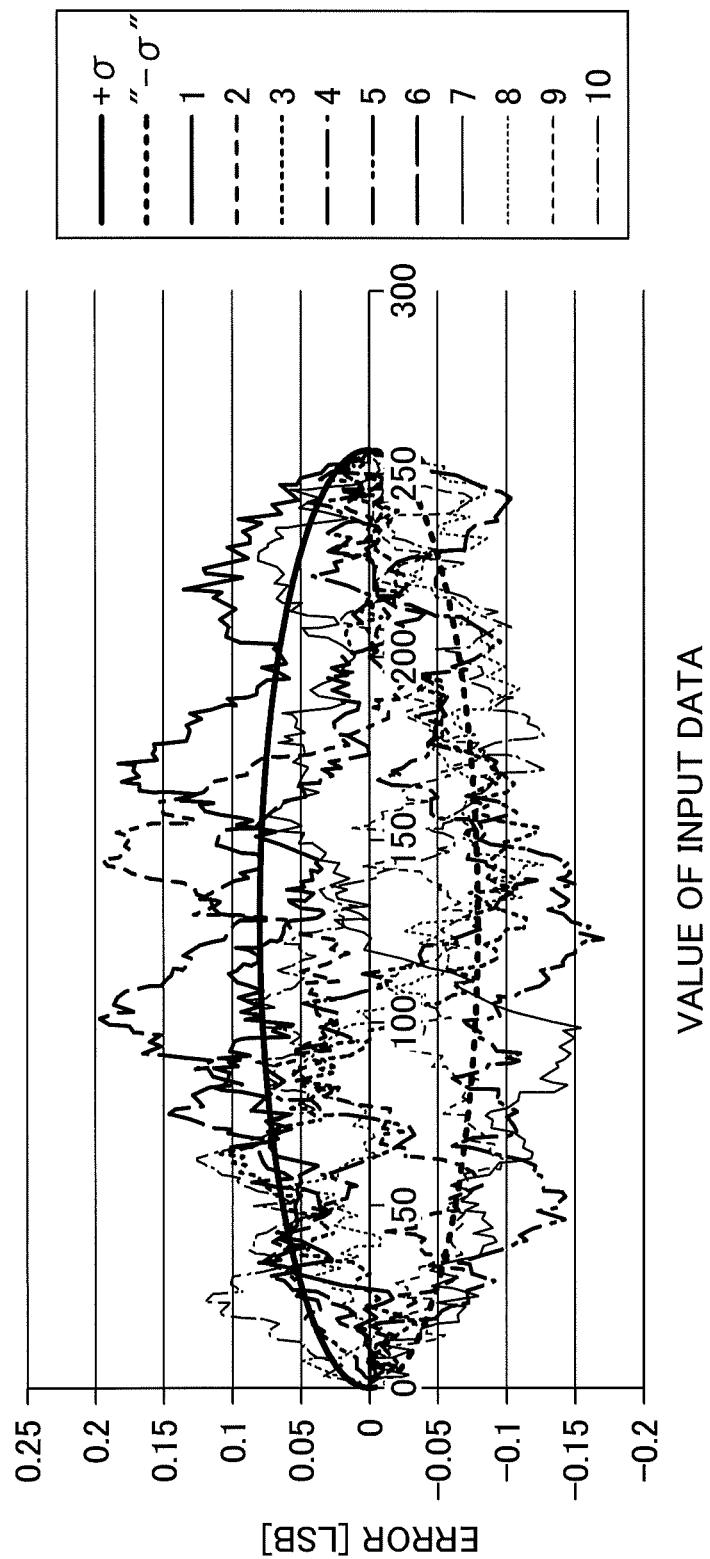

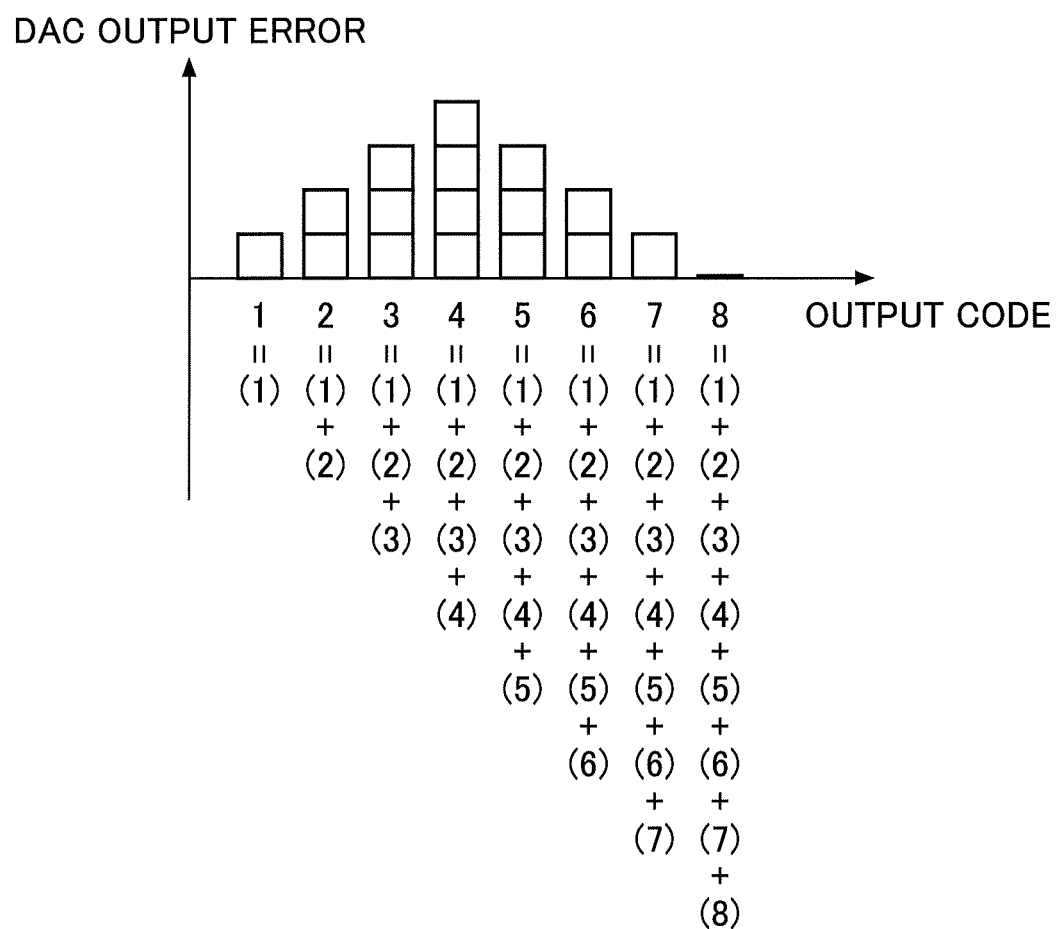

FIG.17A

| DATA[11:9] | | | DECODER OUTPUT SIGNAL | | | | | | | |
|---|---|---|---|---|---|---|---|---|---|---|
| Bit 11 | Bit 10 | Bit 9 | D7 | D6 | D5 | D4 | D3 | D2 | D1 | D0 |
| 1 | 1 | 1 | 1 | 1 | 1 | 1 | 1 | 1 | 1 | 1 |
| 1 | 1 | 0 | 0 | 1 | 1 | 1 | 1 | 1 | 1 | 1 |
| 1 | 0 | 1 | 0 | 0 | 1 | 1 | 1 | 1 | 1 | 1 |
| 1 | 0 | 0 | 0 | 0 | 0 | 1 | 1 | 1 | 1 | 1 |
| 0 | 1 | 1 | 0 | 0 | 0 | 0 | 1 | 1 | 1 | 1 |
| 0 | 1 | 0 | 0 | 0 | 0 | 0 | 0 | 1 | 1 | 1 |
| 0 | 0 | 1 | 0 | 0 | 0 | 0 | 0 | 0 | 1 | 1 |
| 0 | 0 | 0 | 0 | 0 | 0 | 0 | 0 | 0 | 0 | 1 |

FIG.17B

| | COUNTER OUTPUT SIGNAL | | | MULTIPLEXER OUTPUT SIGNAL OUT1 | | | | | | | | MULTIPLEXER OUTPUT SIGNAL OUT2 | | | | | | | |
|---|---|---|---|---|---|---|---|---|---|---|---|---|---|---|---|---|---|---|---|
| | s2 | s1 | s0 | MUX8 | MUX7 | MUX6 | MUX5 | MUX4 | MUX3 | MUX2 | MUX1 | MUX8 | MUX7 | MUX6 | MUX5 | MUX4 | MUX3 | MUX2 | MUX1 |
| FIRST OUTPUT | 0 | 0 | 0 | D7 | D6 | D5 | D4 | D3 | D2 | D1 | D0 | D7 | D6 | D5 | D4 | D3 | D2 | D1 | 0 |
| SECOND OUTPUT | 0 | 0 | 1 | D3 | D2 | D1 | D0 | D7 | D6 | D5 | D4 | D3 | D2 | D1 | 0 | D7 | D6 | D5 | D4 |
| THIRD OUTPUT | 0 | 1 | 0 | D0 | D7 | D6 | D5 | D4 | D3 | D2 | D1 | D0 | D7 | D6 | D5 | D4 | D3 | D2 | D1 |
| FOURTH OUTPUT | 0 | 1 | 1 | D4 | D3 | D2 | D1 | D0 | D7 | D6 | D5 | D4 | D3 | D2 | D1 | 0 | D7 | D6 | D5 |
| FIFTH OUTPUT | 1 | 0 | 0 | D1 | D0 | D7 | D6 | D5 | D4 | D3 | D2 | D1 | 0 | D7 | D6 | D5 | D4 | D3 | D2 |
| SIXTH OUTPUT | 1 | 0 | 1 | D5 | D4 | D3 | D2 | D1 | D0 | D7 | D6 | D5 | D4 | D3 | D2 | D1 | 0 | D7 | D6 |
| SEVENTH OUTPUT | 1 | 1 | 0 | D2 | D1 | D0 | D7 | D6 | D5 | D4 | D3 | D2 | D1 | 0 | D7 | D6 | D5 | D4 | D3 |
| EIGHTH OUTPUT | 1 | 1 | 1 | D6 | D5 | D4 | D3 | D2 | D1 | D0 | D7 | D6 | D5 | D4 | D3 | D2 | D1 | 0 | D7 |

FIG.18A

| | COUNTER OUTPUT SIGNAL | | | DAC8 | | DAC7 | | DAC6 | | DAC5 | | DAC4 | | DAC3 | | DAC2 | | DAC1 | |
|---|---|---|---|---|---|---|---|---|---|---|---|---|---|---|---|---|---|---|---|
| | s2 | s1 | s0 | all_on | enable | all_on | enable | all_on | enable | all_on | enable | all_on | enable | all_on | enable | all_on | enable | all_on | enable |
| FIRST OUTPUT | 0 | 0 | 0 | 0 | D7 | D7 | D6 | D6 | D5 | D5 | D4 | D4 | D3 | D3 | D2 | D2 | D1 | D1 | D0 |
| SECOND OUTPUT | 0 | 0 | 1 | D4 | D3 | D3 | D2 | D2 | D1 | D1 | D0 | D0 | D7 | D7 | D6 | D6 | D5 | D5 | D4 |
| THIRD OUTPUT | 0 | 1 | 0 | D1 | D0 | 0 | D7 | D7 | D6 | D6 | D5 | D5 | D4 | D4 | D3 | D3 | D2 | D2 | D1 |
| FOURTH OUTPUT | 0 | 1 | 1 | D5 | D4 | D4 | D3 | D3 | D2 | D2 | D1 | D1 | D0 | D0 | D7 | D7 | D6 | D6 | D5 |
| FIFTH OUTPUT | 1 | 0 | 0 | D2 | D1 | D1 | D0 | D0 | D7 | D7 | D6 | D6 | D5 | D5 | D4 | D4 | D3 | D3 | D2 |
| SIXTH OUTPUT | 1 | 0 | 1 | D6 | D5 | D5 | D4 | D4 | D3 | D3 | D2 | D2 | D1 | D1 | D0 | D0 | D7 | D7 | D6 |
| SEVENTH OUTPUT | 1 | 1 | 0 | D3 | D2 | D2 | D1 | D1 | D0 | D0 | D7 | D7 | D6 | D6 | D5 | D5 | D4 | D4 | D3 |
| EIGHTH OUTPUT | 1 | 1 | 1 | D7 | D6 | D6 | D5 | D5 | D4 | D4 | D3 | D3 | D2 | D2 | D1 | D1 | D0 | 0 | D7 |

FIG.18B

| DAC INPUT SIGNAL | | | OUTPUT SIGNAL |
|---|---|---|---|
| enable | all_on | DATA[8:3] | |
| 0 | 0 | x(0~63) | 0 (ALL 0) |
| 1 | 0 | x(0~63) | x (0~63) |
| 1 | 1 | x(0~63) | 64 (ALL 1) |

FIG.22

| | COUNTER OUTPUT SIGNAL | | | DAC INPUT SIGNAL | | | | | | | |
|---|---|---|---|---|---|---|---|---|---|---|---|
| | s2 | s1 | s0 | DAC8 | DAC7 | DAC6 | DAC5 | DAC4 | DAC3 | DAC2 | DAC1 |
| FIRST OUTPUT | 0 | 0 | 0 | D2 | D2 | D2 | D2 | D1 | D1 | D0 | 0 |
| SECOND OUTPUT | 0 | 0 | 1 | D2 | D2 | D1 | D1 | D1 | D0 | 0 | D2 |
| THIRD OUTPUT | 0 | 1 | 0 | D2 | D1 | D1 | D0 | D0 | 0 | D2 | D2 |
| FOURTH OUTPUT | 0 | 1 | 1 | D1 | D1 | D0 | 0 | 0 | D2 | D2 | D2 |
| FIFTH OUTPUT | 1 | 0 | 0 | D1 | D0 | 0 | D2 | D2 | D2 | D2 | D2 |
| SIXTH OUTPUT | 1 | 0 | 1 | D0 | 0 | D2 | D2 | D2 | D2 | D2 | D1 |
| SEVENTH OUTPUT | 1 | 1 | 0 | 0 | D2 | D2 | D2 | D2 | D1 | D1 | D1 |
| EIGHTH OUTPUT | 1 | 1 | 1 | D2 | D2 | D2 | D2 | D2 | D1 | D1 | D0 |

D/A CONVERTER, AND A/D CONVERTER

BACKGROUND OF THE INVENTION

1. Field of the Invention

The present invention relates to a D/A converter (digital to analog converter) and an A/D converter (analog to digital converter).

2. Description of the Related Art

DEM (Dynamic element matching) is known as a technique for reducing an error due to fluctuations (variations) of D/A conversion elements of a D/A (Digital to Analog) converter.

For example, a D/A converter with ΔΣ conversion method is known in which a number of switches are turned on in ascending order from a switch determined by a start position determination circuit, the number corresponding to a digital signal, and the start position switch is changed every time the digital signal is input (e.g., refer to Patent Document 1).

CITATION LIST

Patent Document

[Patent Document 1] Japanese Unexamined Patent Application Publication No. H11-31969

SUMMARY OF THE INVENTION

Technical Problem

In a D/A converter with ΔΣ conversion method, in the case where the number of over-samplings is large as described in Patent Document 1, it is possible to reduce an error because a parameter used for averaging output signals is large and the fluctuations (variations) of the D/A conversion elements are averaged according to DEM.

On the other hand, in the D/A converter, in the case where the number of over-samplings is small, a parameter used for averaging is small and an error tends to remain because the fluctuations (variations) of the D/A conversion elements are not sufficiently averaged due to, for example, the difference between the numbers of times the D/A conversion elements become the start position, which is a problem.

The present invention has been made in view of the above problem. An object of the present invention is to provide a D/A converter in which an error with DEM is decreased with the number of over-samplings being reduced.

Solution to Problem

According to an aspect of the present invention, a D/A converter that converts a digital signal with a predetermined number of bits to an analog signal is provided. The D/A converter includes a plurality of component groups that include a plurality of components included in the D/A converter and are connected to an output unit for outputting the analog signal in a predetermined order; and a start position change unit that changes a start position within the plurality of the component groups used for generating a single analog signal when generating the single analog signal corresponding to the digital signal

Advantageous Effects of Invention

According to an embodiment of the present invention, it is possible to reduce an error with DEM while reducing the number of over-samplings.

BRIEF DESCRIPTION OF THE DRAWINGS

FIG. 3A is a drawing illustrating relationships between a change of a shift amount and an order of component groups.

FIG. 3B is a drawing illustrating relationships between a change of a shift amount and an order of component groups.

FIG. 3C is a drawing illustrating relationships between a change of a shift amount and an order of component groups.

FIG. 3D is a drawing illustrating relationships between a change of a shift amount and an order of component groups.

FIG. 4A is a drawing illustrating relationships between a change of a shift amount and an order of component groups.

FIG. 4B is a drawing illustrating relationships between a change of a shift amount and an order of component groups.

FIG. 4C is a drawing illustrating relationships between a change of a shift amount and an order of component groups.

FIG. 5 is a drawing illustrating an example of INL characteristics of a D/A converter according to an embodiment of the present invention.

FIG. 6B is a drawing illustrating an output error of a D/A converter according to an embodiment of the present invention.

FIG. 17A is a drawing illustrating examples of output signals of a decoder according to an application example 1.

FIG. 17B is a drawing illustrating examples of output signals of a counter and a multiplexer according to an application example 1.

FIG. 18A is a drawing illustrating examples of input signals and output signals of component groups according to an application example 1.

FIG. 18B is a drawing illustrating examples of input signals and output signals of component groups according to an application example 1.

FIG. 22 is a drawing illustrating examples of input signals of component groups according to an application example 2.

DETAILED DESCRIPTION OF THE PREFERRED EMBODIMENTS

In the following, an embodiment of the present invention will be described while making reference to the drawings.

<Structure of D/A Converter>

Figure 1:
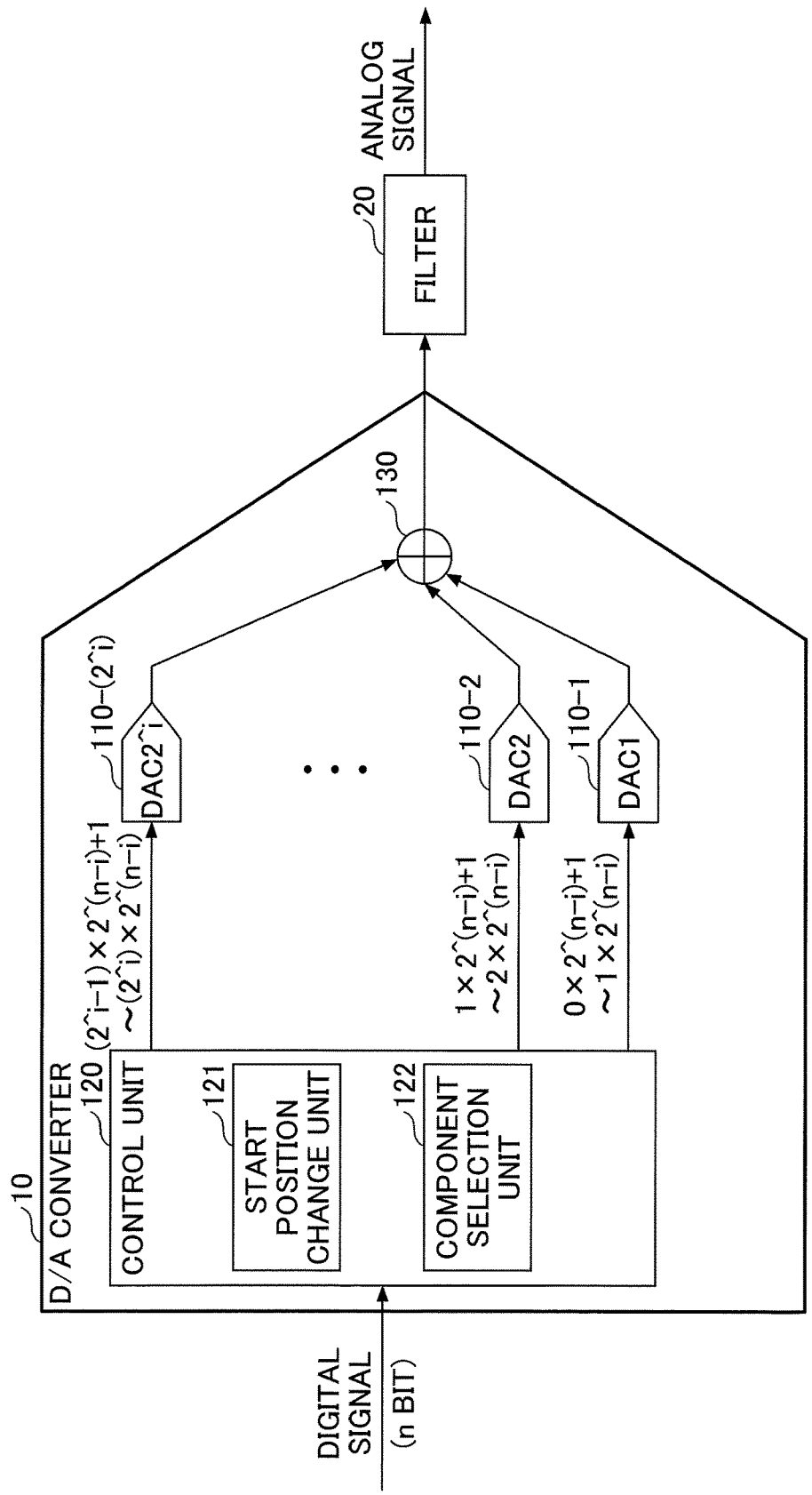
FIG. 1 is a drawing illustrating an example of a structure of a D/A converter according to an embodiment of the present invention.

FIG. 1 is a drawing illustrating an example of a structure of a D/A converter according to an embodiment of the present invention. A D/A converter (Digital to Analog Converter) 10 is a device (or a circuit) for converting an input digital signal with a predetermined number of bits to an analog signal and outputting the converted analog signal. In FIG. 1, the D/A converter 10 includes a plurality of component groups 110-1, 110-2, ..., a control unit 120, and an output unit 130. It should be noted that, in the following descriptions, a term "component group(s) 110" is used for indicating an arbitrary component group(s) of the plurality of the component groups 110-1, 110-2, .... Further, there may be a case in which the plurality of the component groups 110-1, 110-2, ... are respectively referred to as DAC1, DAC2, ....

The plurality of the component groups 110 include a plurality of components included in the D/A converter 10 (hereinafter, referred to as DAC components) and are connected in a predetermined order to an output unit 130 for outputting an analog signal. For example, the plurality of the component groups 110 are configured by dividing the plurality of components (hereinafter referred to as DAC components) included in the n-bit D/A converter 10 ("n" is an integer equal to or greater than 2) into $2^i$ groups ("i" is an integer that satisfies "$1 \le i \le n-1$"). It should be noted that "$2^i$" indicates "2 to the i-th power".

Further, $2^{(n-i)}$ DAC components are included in each of the plurality of the component groups 110. For example, in the case where the D/A converter 10 is an 8-bit D/A converter and the number of the plurality of the component groups 110 is $2^3=8$, as many as $2^{(8-3)}=32$ DAC components are included in each of the plurality of the component groups 110. It should be noted that each of the DAC components includes, for example, D/A conversion elements such as current sources, resistance elements, switches for selecting the D/A conversion elements as included in the component group 110-1 illustrated in FIG. 15.

The control unit 120 performs converting an n-bit digital signal input from outside the D/A converter to an analog signal using the plurality of the DAC components. The control unit 120 includes, for example, a start position change unit 121 and a component selection unit 122.

When generating a single analog signal corresponding to an input digital signal, the start position change unit 121 changes (shifts) a start position within the component groups 110 used for generating the single analog signal by using a predetermined shift pattern.

Preferably, the predetermined shift pattern includes two or more different shift amounts.

Further, the start position change unit 121 shifts (changes) the start position within the component groups 110 used for generating analog signals for ($2^i$) times, which is the same as the number of the component groups 110, by using the predetermined shift pattern.

Alternatively, the start position change unit 121 may shift (change) the start position within the component groups 110 used for generating the single analog signal for ($2^i$)*j times ("j" is an integer equal to or greater than 1), which is the same as an integer multiple of the number of the component groups 110, by using the predetermined shift pattern.

Preferably, when generating the single analog signal corresponding to an input digital signal, the start position change unit 121 shifts (changes) the start position in such a way that each of the component groups 110 takes the start position for the same number of times (e.g., once). It should be noted that the specific method of shifting the start position will be described later.

The component selection unit 122 selects (connects to the output unit 130) a number of DAC components, the number corresponding to the input digital signal, by starting from one of the component groups 110 as the start position, for example, by using the thermometer coding.

(Regarding the Change of Start Position)

Figure 2A:
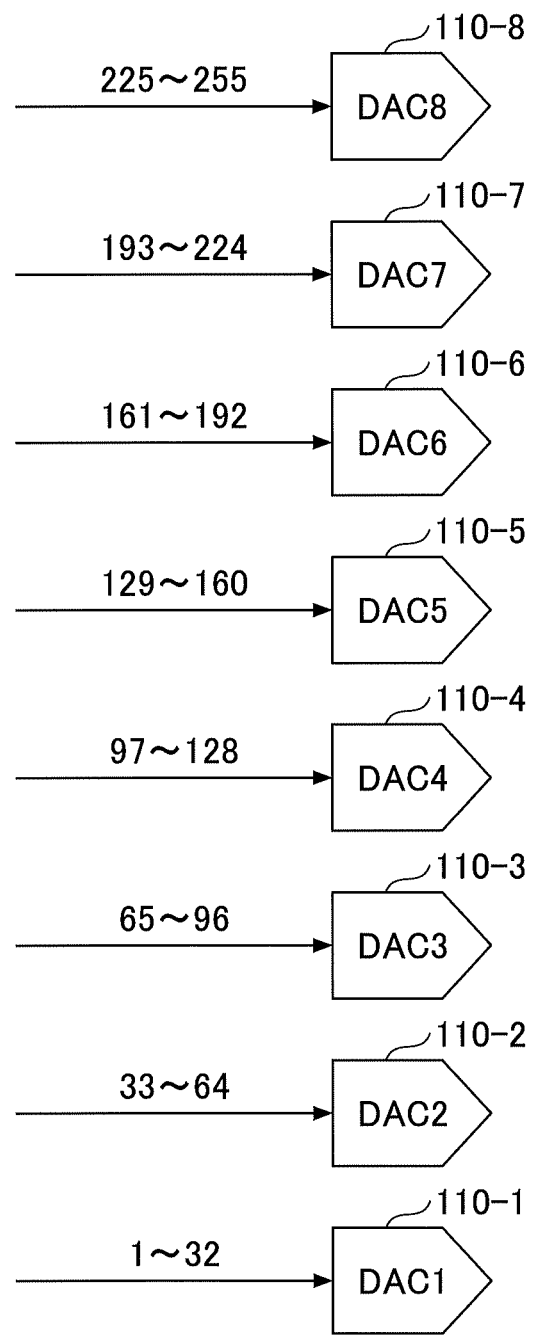
FIG. 2A is a drawing illustrating a change of a start position.
Figure 2B:
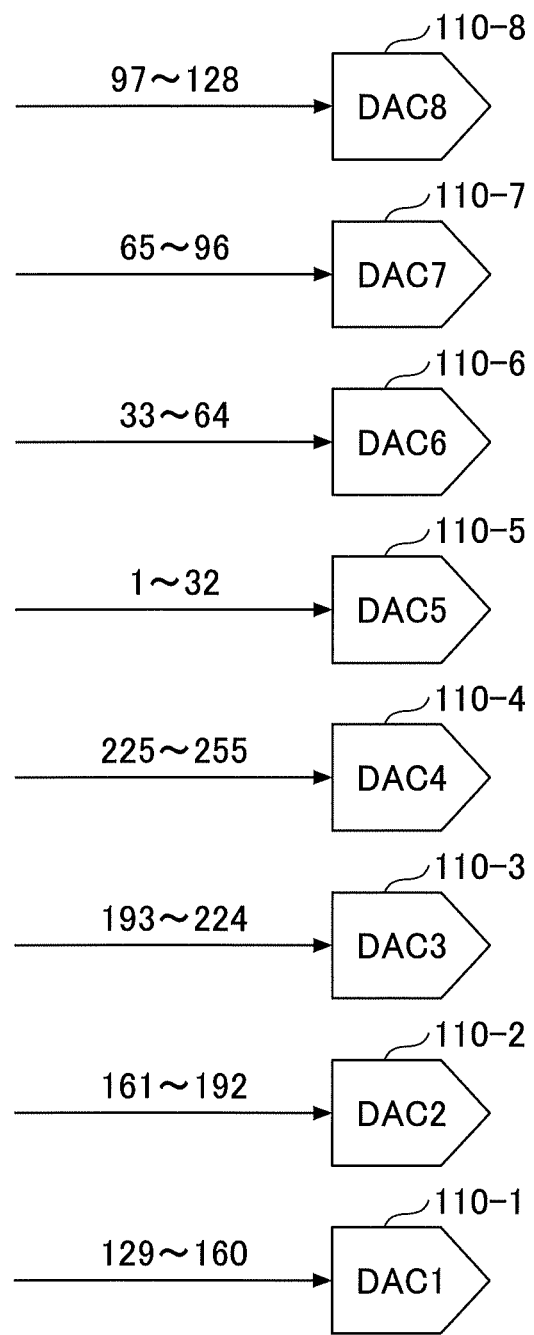
FIG. 2B is a drawing illustrating a change of a start position.
Figure 2C:
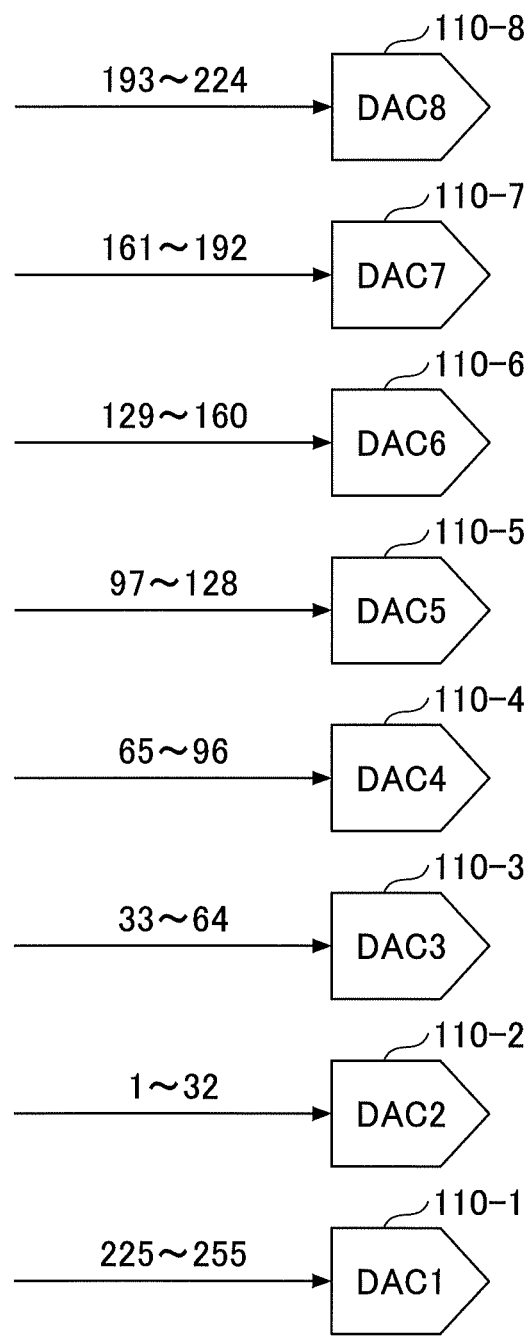
FIG. 2C is a drawing illustrating a change of a start position.

FIG. 2A to FIG. 2C are drawings illustrating the change of the start position. Here, an example will be described in which the D/A converter 10 is an 8-bit D/A converter and the number of the component groups 110 is 8.

In an example of FIG. 2A, an initial state before the change of the start position by the start position change unit 121 is illustrated. In FIG. 2A, the start position is the component group 110-1. The component group 110-1 includes DAC components corresponding to a specified range of lower 1 to 32 of 255 DAC components included in the 8-bit D/A converter 10.

Similarly, the component groups 110-2 to 110-8 include DAC components corresponding to specified ranges illustrated in FIG. 2A. For example, the component group 110-2 includes DAC components corresponding to a specified range of 33 to 64.

When an 8-bit digital signal is input, the component selection unit 122 selects a number of DAC components starting from the DAC component "1" of the component group 110-1 as the starting position, the number corresponding to the value of the digital signal. For example, in the case where the value of the input digital signal is "128", the component selection unit 122 selects the DAC components of a specified range of 1 to 128, and, for example, connects the selected DAC components to the output unit 130.

According to the above operations, in each of the component groups 110, in the case where the value of the input digital signal (hereinafter, referred to as an input value) is less than the range specified for the component group 110, all of the DAC components included in the component group 110 output "0" (hereinafter, referred to as all "0"). Further, in each of the component groups 110, in the case where the input value is included in the range specified for the component group 110, an output signal is output by using a number of DAC components, the number corresponding to the input value. Furthermore, in each of the component groups 110, in the case where the input value is greater than the range specified for the component group 110, all of the DAC components included in the component group 110 output "1" (hereinafter, referred to as all "1").

FIG. 2B illustrates an example of a case in which the start position change unit 121 has shifted the start position by "4" (groups) from the state of FIG. 2A, and the start position has been changed to the component group 110-5. In FIG. 2B, the start position is the component group 110-5, and the component group 110-5 includes the DAC components corresponding to a specified range of 1 to 32. Similarly, the component groups 110-1 to 110-4 and the component groups 110-6 to 110-8 include DAC components corresponding to specified ranges illustrated in FIG. 2B.

FIG. 2C illustrates an example of a case in which the start position change unit 121 has further shifted the start position by "5" (groups) from the state of FIG. 2B, and the start position has been changed to the component group 110-2. In FIG. 2C, the start position is the component group 110-2, and the component group 110-2 includes the DAC components corresponding to a specified range of 1 to 32. Similarly, the component group 110-1 and the component groups 110-3 to 110-8 include DAC components corresponding to specified ranges illustrated in FIG. 2C.

In this way, after changing the start position within the component groups 110 from the component group 110-1 to the component group 110-8 by shifting sequentially in ascending order, the start position change unit 121 changes the start position to the component group 110-1 again and repeats the similar shifting. Further, the specified range for each of the component groups 110 is changed according to the change of the start position by the start position change unit 121.

Here, returning back to FIG. 1, the structure of the D/A converter will be continued to be described.

Figure 15:
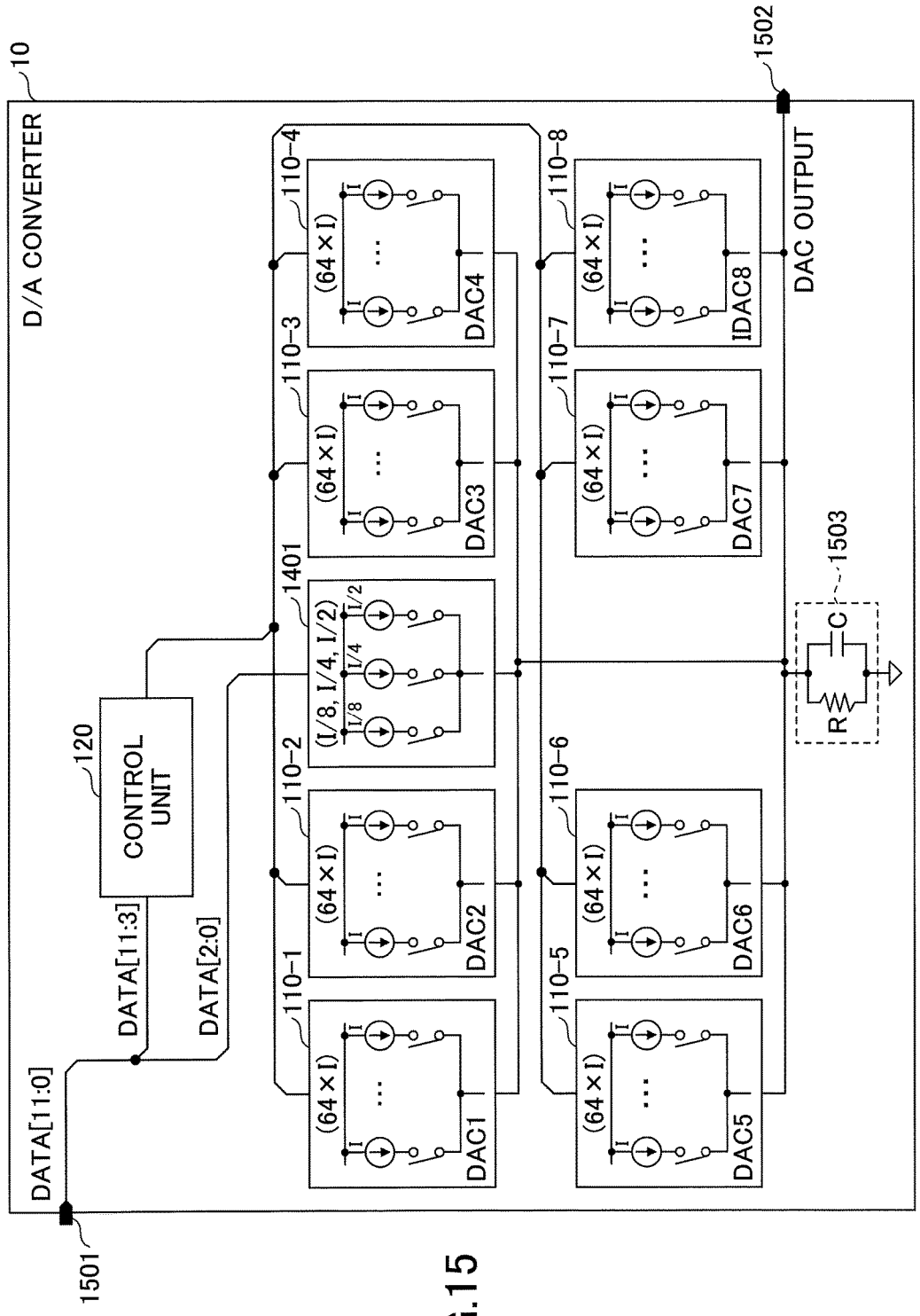
FIG. 15 is a block diagram illustrating an example of a D/A converter according to an application example 1.

The output unit 130 is a circuit that is connected to the plurality of the component groups 110 and outputs an analog signal. The output unit 130 includes a resistance element R, etc., that is connected to a ground potential (or a power supply potential) as illustrated in, for example, an output circuit 1503 in FIG. 15. For example, in the case where the DAC components of the D/A converter 10 are current sources as illustrated in FIG. 15, an output voltage is determined by controlling the current that flows in the resistance element R according to the number of the selected DAC components. It should be noted that the filter 20 is provided externally in an example of FIG. 1. The filter 20 may be included in the output unit 130.

The filter 20 is a low-pass filter that is used for averaging the analog signals output from the D/A converter 10. It should be noted that the low-pass filter will be described later.

(Shift Amount and the Order of the Component Groups)

Next, examples of the shift amount of the start position within the component groups 110 and examples of the order of the component groups 110 according to an embodiment of the present invention will be described.

FIG. 3A to FIG. 3D and FIG. 4A to FIG. 4C are drawings illustrating relationships between the change of the shift amount and the order of the component groups. Here, the following descriptions are based on the assumption that, when generating a single analog signal corresponding to an input digital signal, the D/A converter 10 outputs an analog signal for eight times by changing the start position within the component groups 110.

FIG. 3A illustrates the order of the component groups 110 in the case where the shift amount is fixed to "1" and an analog signal is output for eight times. It should be noted that DAC1, DAC2, DAC3, . . . , in the figure correspond to the component groups 110-1, 110-2, 110-3, . . . , in FIG. 1, respectively. Further, numbers in parenthesis in the figure indicate the order of the component groups 110. For example, (1) indicates the first component group 110 (that is, the component group 110 as the start position), and (2) indicates the second component group 110.

Referring to the dashed line in FIG. 3A (the order (1) of the component groups), it can be seen that the start position within the component groups 110 is shifted every time by one group as "DAC1, DAC2, DAC3, DAC4, DAC5, DAC6, DAC7, DAC8", and that all of the component groups. 110 take the start position once. Further, by referring to each of the orders (2) to (8) of the component groups similar to the order (1) of the component groups, it can be seen that each of DAC1 to DAC8 is selected once. Not only the start position referred to as the order (1) of the component groups, but also the orders (2) to (8) of the component groups are equally selected. In other words, as all of the component groups 110 are used equally, errors of the eight component groups 110 are canceled by obtaining a single analog signal by averaging analog signals output for eight times from the D/A converter 10.

FIG. 3B illustrates the order of the component groups 110 in the case where the shift amount is fixed to "2" and an analog signal is output for eight times. Referring to the dashed line in FIG. 3B (the order (1) of the component groups), the start position within the component groups 110 is shifted every time by two as "DAC1, DAC3, DAC5, DAC7, DAC1, DAC3, DAC5, DAC7". According to the above operations, each of the component groups 110-1, 110-3, 110-5, and 110-7 takes the start position twice, and none of the component groups 110-2, 110-4, and 110-6 takes the start position. In this case, as all of the component groups 110 are not used equally, errors of the eight component groups 110 are not canceled and some error remains even if a single analog signal is obtained by averaging analog signals output for eight times from the D/A converter 10.

FIG. 3C illustrates the order of the component groups 110 in the case where the shift amount is fixed to "3" and an analog signal is output for eight times. Referring to the dashed line in FIG. 3C (the order (1) of the component groups), it can be seen that the start position within the component groups 110 is shifted every time by three as "DAC1, DAC4, DAC7, DAC2, DAC5, DAC8, DAC3, DAC6", and that all of the component groups 110 take the start position once. Further, by referring to each of the orders (2) to (8) of the component groups similar to the order (1) of the component groups, it can be seen that each of DAC1 to DAC8 is selected once. Not only the start position referred to as the order (1) of the component groups, but also the orders (2) to (8) of the component groups are equally selected. In other words, as all of the component groups 110 are used equally, errors of the eight component groups 110 are canceled by obtaining a single analog signal by averaging analog signals output for eight times from the D/A converter 10.

FIG. 3D illustrates the order of the component groups 110 in the case where the shift amount is fixed to "4" and an analog signal is output for eight times. Referring to the dashed line in FIG. 3D (the order (1) of the component groups), the start position within the component groups 110 is shifted every time by four as "DAC1, DAC5, DAC1, DAC5, DAC1, DAC5, DAC1, DAC5". According to the above operations, none of the component groups 110-2, 110-3, 110-4, 110-6, and 110-7 takes the start position. In this case, as all of the component groups 110 are not used equally, errors of the eight component groups 110 are not canceled and some error remains even if a single analog signal is obtained by averaging analog signals output for eight times from the D/A converter 10.

FIG. 4A illustrates the order of the component groups 110 in the case where the shift amount is fixed to "5" and an analog signal is output for eight times. Referring to the dashed line in FIG. 3C (the order (1) of the component groups), it can be seen that the start position within the component groups 110 is shifted every time by five as "DAC1, DAC6, DAC3, DAC8, DAC5, DAC2, DAC7, DAC4", and that all of the component groups 110 take the start position once. Further, by referring to each of the orders (2) to (8) of the component groups similar to the order (1) of the component groups, it can be seen that each of DAC1 to DAC8 is selected once. Not only the start position referred to as the order (1) of the component groups, but also the orders (2) to (8) of the component groups are equally selected. In other words, as all of the component groups 110 are used equally, errors of the eight component groups 110 are canceled by obtaining a single analog signal by averaging analog signals output for eight times from the D/A converter 10.

FIG. 4B illustrates the order of the component groups 110 in the case where the shift amount is fixed to "6" and an analog signal is output for eight times. Referring to the dashed line in FIG. 3B (the order (1) of the component groups), the start position within the component groups 110 is shifted every time by six as "DAC1, DAC7, DAC5, DAC3, DAC1, DAC7, DAC5, DAC3". According to the above operations, none of the component groups 110-2, 110-4, and 110-6 takes the start position. In this case, as all of the component groups 110 are not used equally, errors of the eight component groups 110 are not canceled and some error remains even if a single analog signal is obtained by averaging analog signals output for eight times from the D/A converter 10.

FIG. 4C illustrates the order of the component groups 110 in the case where the shift amount is fixed to "7" and an analog signal is output for eight times. Referring to the dashed line in FIG. 4C (the order (1) of the component groups), it can be seen that the start position within the component groups 110 is shifted every time by seven as "DAC1, DAC8, DAC7, DAC6, DAC5, DAC4, DAC3, DAC2", and that all of the component groups 110 take the start position once. Further, by referring to each of the orders (2) to (8) of the component groups similar to the order (1) of the component groups, it can be seen that each of DAC1 to DAC8 is selected once. Not only the start position referred to as the order (1) of the component groups, but also the orders (2) to (8) of the component groups are equally selected. In other words, as all of the component groups 110 are used equally, errors of the eight component groups 110 are canceled by obtaining a single analog signal by averaging analog signals output for eight times from the D/A converter 10.

In this way, it can be seen that there is a component group 110 that is not selected as the start position in the case where the number of the component groups 110 is an even number and the shift amount is only an even number. Therefore, in the case where the number of the component groups 110 is an even number, it is desirable that a shift amount of an odd number is included in the shift amounts used by the start position change unit 121.

(Shift Amount and Frequency of Output Error)

In general, it is most likely that the non-linear error of the D/A converter 10 becomes the largest at the half of the full scale. It should be noted that the full scale (hereinafter, referred to as "FS") is a maximum value that the D/A converter 10 is enabled to output. In an 8-bit D/A converter 10, FS is $(2^8)-1=255$.

FIG. 5 is a graph illustrating an example of INL (Integral Non-Linearity) characteristics of a D/A converter according to an embodiment of the present invention. INL is an index related to accuracy or an error of the D/A converter 10. INL is also referred to as an integral non-linear error. FIG. 5 illustrates an example of INL characteristics of an 8-bit D/A converter 10 whose output is calculated according to a random number.

In FIG. 5, lines 1 to 10 indicate ten types of INL characteristics calculated according to a random number. Further, lines denoted by +σ and −σ indicate standard deviations of INL with respect to each code. As illustrated in FIG. 5, the error gradually increases as the value of the input data increases, and the error decreases again after the value of the input data exceeds FS/2.

Figure 6A:
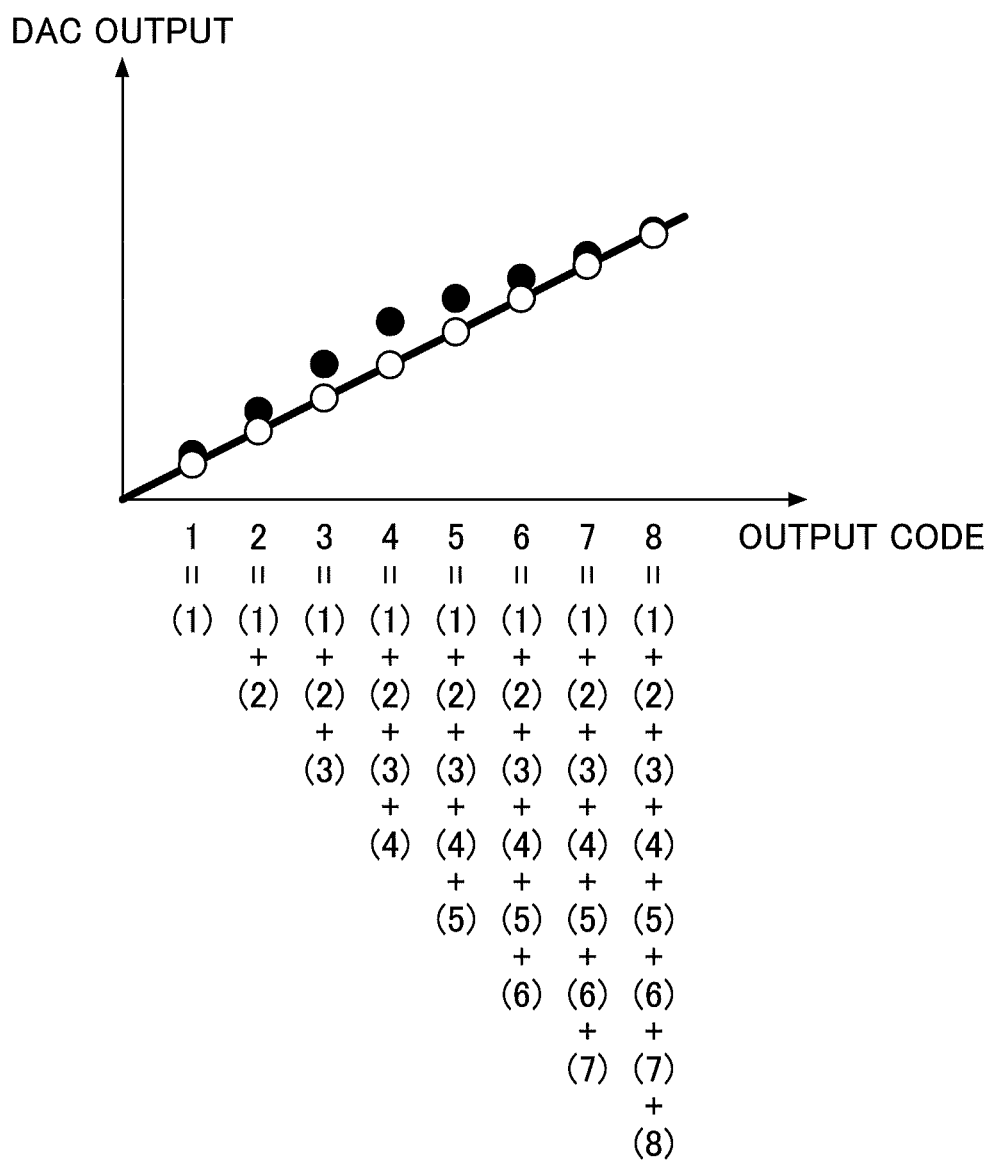
FIG. 6A is a drawing illustrating an output error of a D/A converter according to an embodiment of the present invention.

FIG. 6A and FIG. 6B are drawings illustrating the output error of a D/A converter according to an embodiment of the present invention.

FIG. 6A illustrates a relationship between the component groups 110 of the D/A converter 10 and the values (hereinafter, referred to as "DAC output") of the output signal of the D/A converter 10.

The horizontal axis in FIG. 6A and FIG. 6B indicates the output code of the D/A converter 10. "1" in the horizontal axis indicates the maximum value of the output code that the first component group (1) illustrated in FIG. 3A to FIG. 4C is enabled to output (e.g., 32). "2" in the horizontal axis indicates the maximum value that the first component group (1) and the second component group (2) illustrated in FIG. 3A to FIG. 4C are enabled to output (e.g., 64). "3" in the horizontal axis indicates the maximum value that the first component group (1) to the third component group (3) illustrated in FIG. 3A to FIG. 4C are enabled to output (e.g., 96). "4" in the horizontal axis indicates the maximum value that the first component group (1) to the fourth component group (4) illustrated in FIG. 3A to FIG. 4C are enabled to output (e.g., 128). It should be noted that, in an example in FIG. 6A and FIG. 6B, "4" in the horizontal axis corresponds to FS/2 at which the error is considered to be the largest.

Further, "5" in the horizontal axis in FIG. 6A and FIG. 6B indicates the maximum value that the first component group (1) to the fifth component group (5) illustrated in FIG. 3A to FIG. 4C are enabled to output (e.g., 160). "6" in the horizontal axis indicates the maximum value that the first component group (1) to the sixth component group (6) illustrated in FIG. 3A to FIG. 4C are enabled to output (e.g., 192). "7" in the horizontal axis indicates the maximum value that the first component group (1) to the seventh component group (7) illustrated in FIG. 3A to FIG. 4C are enabled to output (e.g., 224). "8" in the horizontal axis indicates the maximum value that is enabled to be output by using the eight component groups 110, that is, FS (e.g., 255).

White circles in FIG. 6A indicate DAC outputs (DAC output 1) when there is no fluctuation (variation) in the DAC components (elements). On the other hand, black circles in FIG. 6A indicate examples of the DAC outputs (DAC output 2) when there are fluctuations (variations) in the DAC components.

FIG. 6B illustrates differences between the DAC output 1 and the DAC output 2, that is, DAC output errors. In an example illustrated in FIG. 6B, the DAC output error is the largest at "4" in the horizontal axis, that is, at FS/2.

Here, by using this model, the shift amount is studied in order to provide preferable changes (hereinafter, referred to as AC characteristics) of the output voltage for outputting the same output value.

Figure 7A:
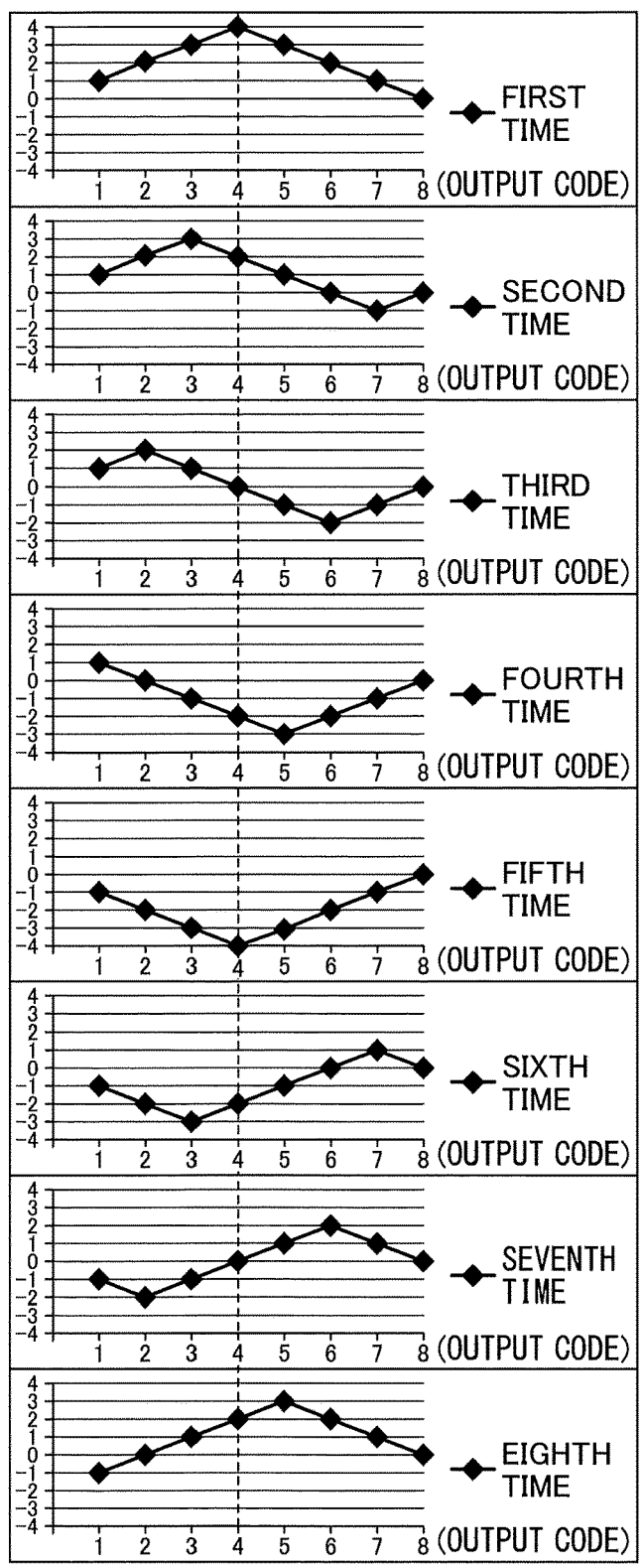
FIG. 7A is a drawing illustrating a change of an output error in the case where the shift amount is 1.
Figure 7B:
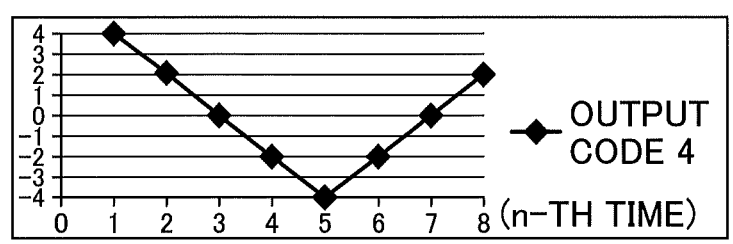
FIG. 7B is a drawing illustrating a change of an output error in the case where the shift amount is 1.

FIG. 7A and FIG. 7B are graphs illustrating an example of a change of an output error in the case where the shift amount is 1. FIG. 7A illustrates the change of the output error of the D/A converter 10 in the case where the shift amount is 1 and the start position is changed during the first output through the eighth output. In FIG. 7A, the numbers "1" to "8" in the horizontal axis of each of the graphs correspond to the output codes "1" to "8" in the horizontal axis in FIG. 6A and FIG. 6B. The vertical axis indicates the error of the output signal of the D/A converter 10.

For example, in the first graph in FIG. 7A, the output error of the output code "4" indicates the output error in the case where the start position is as illustrated in FIG. 2A and an analog signal at FS/2 is output by using the component groups 110-1 to 110-4.

Further, the fifth graph in FIG. 7A indicates the output error in a state in which the start position has been shifted four times with the shift amount 1 from the first graph, that is, the output error in the case where the start position is as illustrated in FIG. 2B. Therefore, for example, in the fifth graph in FIG. 7A, the output error of the output code "4" indicates the output error in the case where an analog signal at FS/2 is output by using the component groups 110-5 to 110-8.

As illustrated in FIG. 7A, there are fluctuations (variations) in the output values for outputting the same value, and the fluctuation (output error) becomes the largest at the output code "4", that is, at the time when outputting the value of FS/2.

FIG. 7B illustrates the change, of the output error when outputting the value of FS/2, during the outputs from the first output to the eighth output.

Here, when a frequency, at which the D/A converter 10 outputs a single analog signal corresponding to an input value, is referred to as "fdac", a frequency of an output error with respect to an output code "4" at which the output error is the largest can be roughly obtained as a reference value according to the following formula.

(Frequency)=fdac/((the number of shifts in one cycle)/(shift amount))

In an example of FIG. 7B, the number of shifts in one cycle is "8" and the shift amount is "1". Therefore, the frequency of the output error is fdac/(8/1)=fdac/8.

Figure 8A:
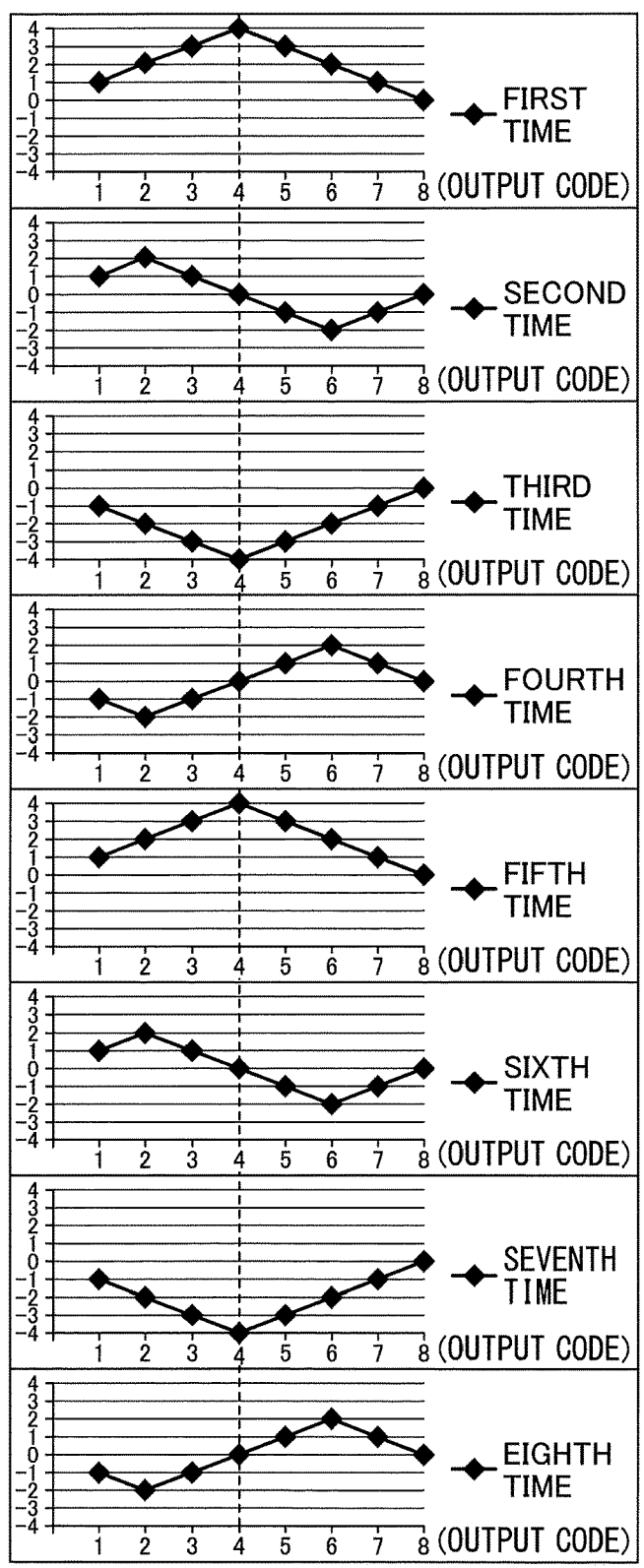
FIG. 8A is a drawing illustrating a change of an output error in the case where the shift amount is 2.
Figure 8B:
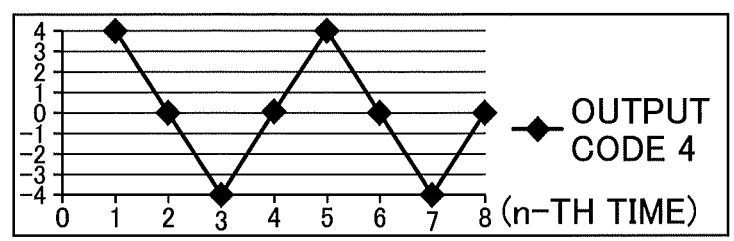
FIG. 8B is a drawing illustrating a change of an output error in the case where the shift amount is 2.

FIG. 8A and FIG. 8B are graphs illustrating an example of the change of the output error in the case where the shift amount is 2. FIG. 8A illustrates the change of the output error of the D/A converter 10 in the case where the shift amount is 2 and the start position is changed during the first output through the eighth output. The first graph in FIG. 8A is the same as the first graph in FIG. 7A. Further, for example, the second graph in FIG. 8A illustrates the change of the output error in the case where the start position is shifted by 2 from the component group 110-1 as the first start position in the first graph to the component group 110-3 as the second start position.

FIG. 8B illustrates the change, of the output error when outputting the output code "4" (that is, the value of FS/2) in FIG. 8A, during the outputs from the first output through the eighth output. In an example of FIG. 8B, the number of shifts in one cycle is "8" and the shift amount is "2". Therefore, the frequency of the output error is fdac/(8/2)=fdac/4.

Figure 9A:
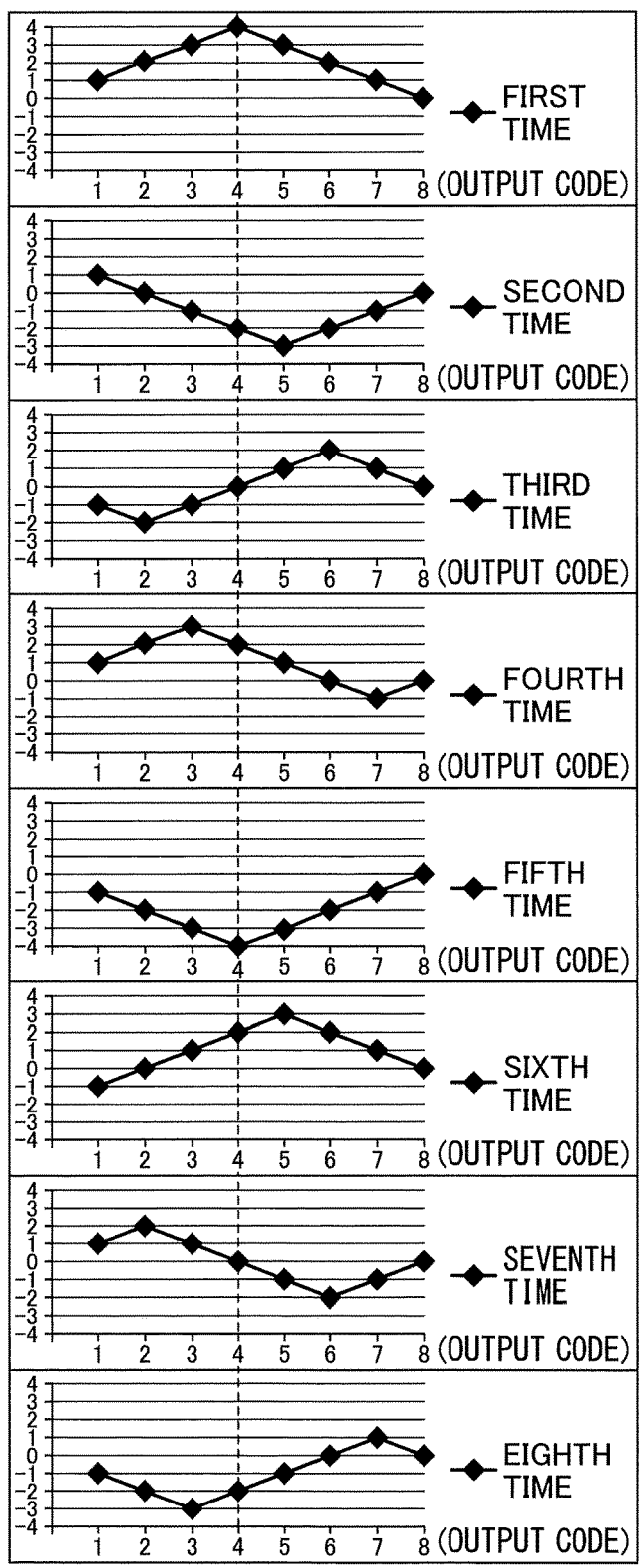
FIG. 9A is a drawing illustrating a change of an output error in the case where the shift amount is 3.
Figure 9B:
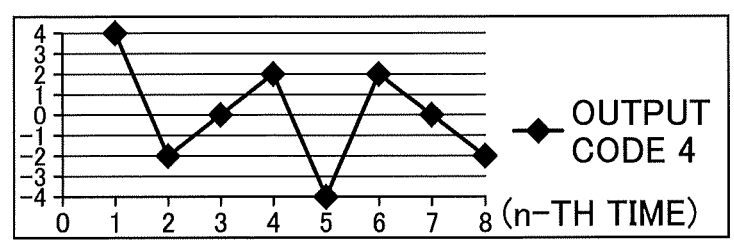
FIG. 9B is a drawing illustrating a change of an output error in the case where the shift amount is 3.

FIG. 9A and FIG. 9B are graphs illustrating an example of the change of the output error in the case where the shift amount is 3. FIG. 9A illustrates the change of the output error of the D/A converter 10 in the case where the shift amount is 3 and the start position is changed during the first output through the eighth output. The first graph in FIG. 9A is the same as the first graph in FIG. 7A. Further, for example, the second graph in FIG. 9A illustrates the change of the output error in the case where the start position is shifted by 3 from the component group 110-1 as the first start position in the first graph to the component group 110-4 as the second start position.

FIG. 9B illustrates the change, of the output error when outputting "4" in the horizontal axis in FIG. 9A (that is, the value of FS/2), during the outputs from the first output through the eighth output. In an example of FIG. 9B, the number of shifts in one cycle is "8" and the shift amount is "3". Therefore, the frequency of the output error is fdac/(8/3)=fdac/(8/3).

Figure 10A:
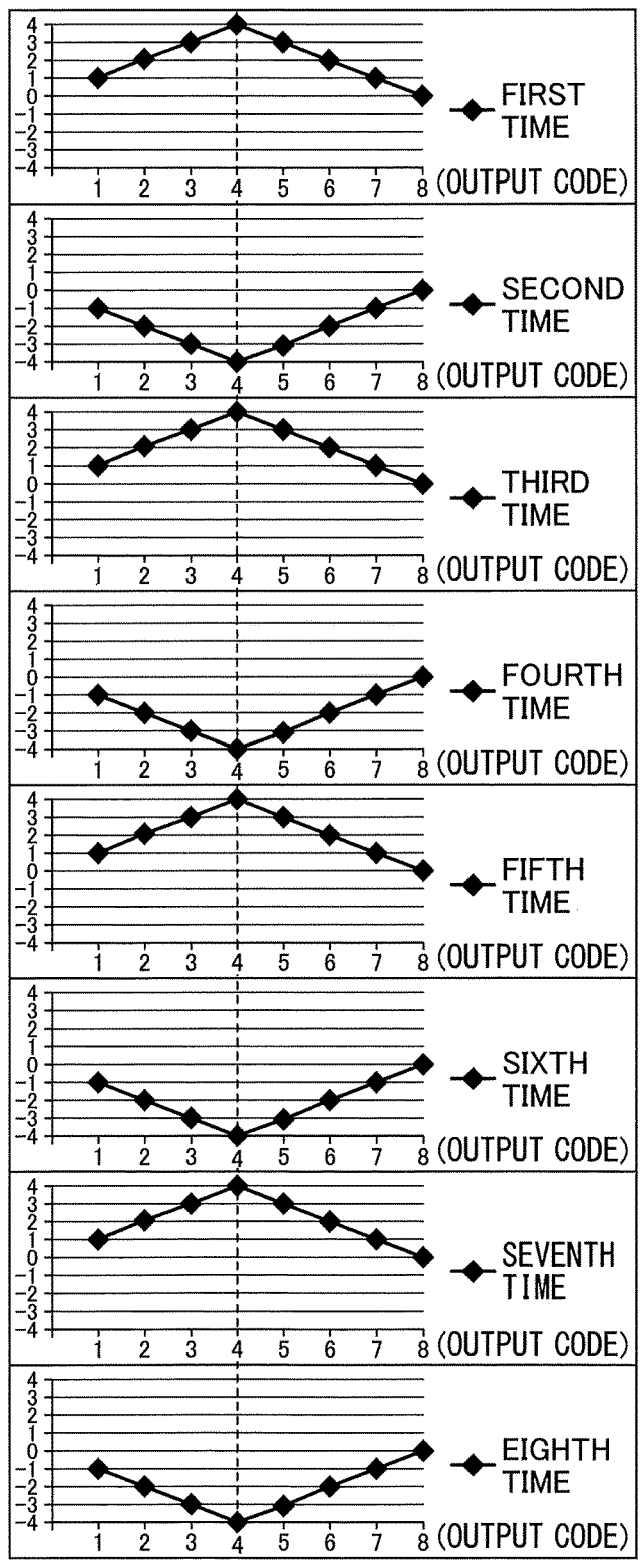
FIG. 10A is a drawing illustrating a change of an output error in the case where the shift amount is 4.
Figure 10B:
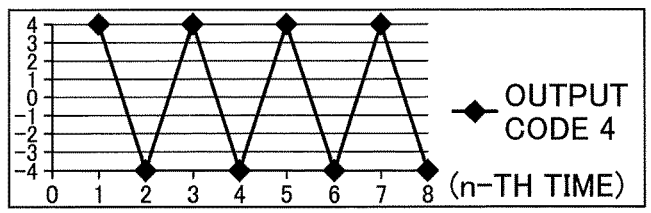
FIG. 10B is a drawing illustrating a change of an output error in the case where the shift amount is 4.

FIG. 10A and FIG. 10B are graphs illustrating an example of the change of the output error in the case where the shift amount is 4. FIG. 10A illustrates the change of the output error of the D/A converter 10 in the case where the shift amount is 4 and the start position is changed during the first output through the eighth output. The first graph in FIG. 10A is the same as the first graph in FIG. 7A. Further, for example, the second graph in FIG. 10A illustrates the change of the output error in the case where the start position is shifted by 4 from the component group 110-1 as the first start position in the first graph to the component group 110-5 as the second start position.

FIG. 10B illustrates the change, of the output error when outputting "4" in the horizontal axis in FIG. 10A (that is, the value of FS/2), during the outputs from the first output through the eighth output. In an example of FIG. 10B, the number of shifts in one cycle is "8" and the shift amount is "4". Therefore, the frequency of the output error is fdac/(8/4)=fdac/2.

Figure 11A:
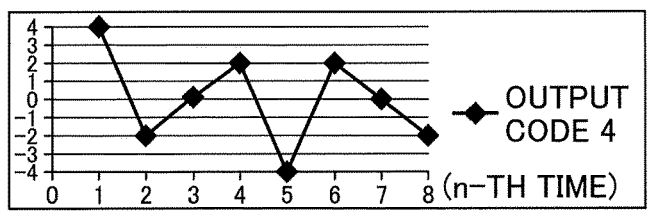
FIG. 11A is a drawing illustrating a change of an output error in the case where the shift amount is 5.
Figure 11B:
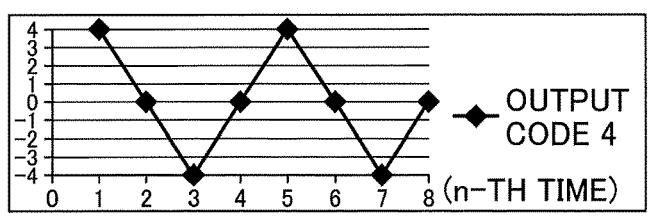
FIG. 11B is a drawing illustrating a change of an output error in the case where the shift amount is 6.
Figure 11C:
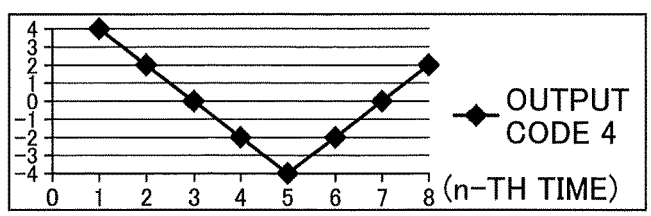
FIG. 11C is a drawing illustrating a change of an output error in the case where the shift amount is 7.

FIG. 11A to FIG. 11C are graphs illustrating examples of the change of the output error in the case where the shift amount is 5 to 7, respectively. In the case where the number of the component groups 110 is 8, the shift amount being 5 to 7 corresponds to the shift amount being −3 to −1, and the frequency of the output error at FS/2, at which the output error is the largest, can be obtained by the following formula.

(Frequency)=fdac/((the number of shifts in one cycle)/((the number of shifts in one cycle)−(shift amount))

FIG. 11A illustrates the change, of the output error when outputting the value of FS/2, during the outputs from the first output through the eighth output in the case where the shift amount is 5. In an example of FIG. 11A, the number of shifts in one cycle is "8" and the shift amount is "5". Therefore, the frequency of the output error is fdac/(8/(8−5))=fdac/(8/3).

FIG. 11B illustrates the change, of the output error when outputting the value of FS/2, during the outputs from the first output to the eighth output in the case where the shift amount is 6. In an example of FIG. 11B, the number of shifts in one cycle is "8" and the shift amount is "6". Therefore, the frequency of the output error is fdac/(8/(8−6))=fdac/4.

FIG. 11C illustrates the change, of the output error when outputting the value of FS/2, during the outputs from the first output to the eighth output in the case where the shift amount is 7. In an example of FIG. 11C, the number of shifts in one cycle is "8" and the shift amount is "7". Therefore, the frequency of the output error is fdac/(8/(8−7))=fdac/8.

In this way, the frequency of the output error can be roughly represented by the following two generic formulas according to the shift amount, by which the start position within the component groups 110 is changed (shifted), and the number of the shifts during a period in which the D/A converter 10 outputs a single analog signal.

In the case where (shift amount during one cycle)>(the number of shifts during one cycle)/2, (Frequency)=fdac/((the number of shifts in one cycle)/(shift amount during one cycle)).

In the case where (shift amount during one cycle)<(the number of shifts during one cycle)/2, (Frequency)=fdac/((the number of shifts in one cycle)/(1−(shift amount during one cycle))).

Further, in the case where the number of the component groups 110 of the D/A converter 10 is $2^i$, the frequency of the output error at FS/2 at which the error of the output signal is the largest becomes the highest when the shift amount is $2^{(i-1)}$. For example, in the case where the number of the component groups 110 is $2^3=8$, the frequency of the output error becomes the highest when the shift amount is $2^{(3-1)}=4$.

(Regarding Low-Pass Filter)

Figure 12A:
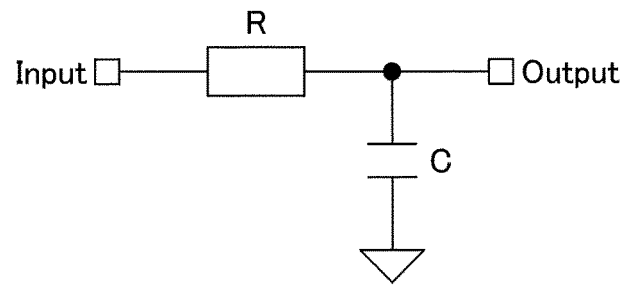
FIG. 12A is a drawing illustrating an example of a filter according to an embodiment of the present invention.
Figure 12B:
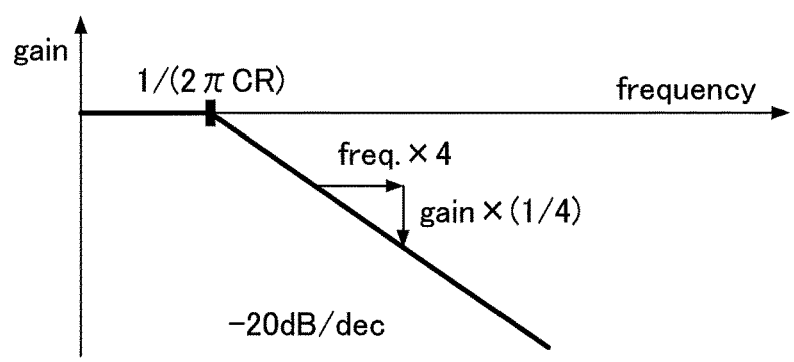
FIG. 12B is a drawing illustrating an example of a filter according to an embodiment of the present invention.

FIG. 12A and FIG. 12B are drawings illustrating an example of a filter according to an embodiment of the present invention. FIG. 12A illustrates an example of an RC low-pass filter including a resistor R and a capacitor C (hereinafter, referred to as "LPF"). It should be noted that the LPF illustrated in FIG. 12A is an example of the filter 20 illustrated in FIG. 1.

FIG. 12B illustrates frequency characteristics of the LPF illustrated in FIG. 12A. Signals of frequency higher than the cut-off frequency "$1/(2\pi CR)$" are attenuated by the LPF according to "−20 dB/dec". According to the above, when the frequency of a signal input to the LPF increases by 4 times, the output level is decreased to ¼.

Therefore, it is possible to increase the error reduction effects by the LPF by converting the frequencies of the output error illustrated in FIG. 7A to FIG. 11C to higher frequencies.

(Preferable Shift Amount)

According to the discussion illustrated in FIG. 3A to FIG. 12B, it can be understood that, when the number of the component groups 110 of the D/A converter 10 is $2^i$, it is desirable that the shift amount of the start position according to the start position change unit 121 includes $2^{(i-1)}$. In this way, it is possible to cause the frequency of the output error for FS/2, at which the error is the largest, to be higher frequency, and it is possible to increase the error reduction effects by the LPF.

Further, it is desirable that the shift amount of the start position according to the start position change unit 121 includes an odd number. According to the above, it is possible for all of the component groups 110 to be selected as the start position by the start position change unit 121. Therefore, it is possible to use the DAC components without bias (evenly, equally), and it is possible to decrease an error when output signals are averaged.

Figure 13A:
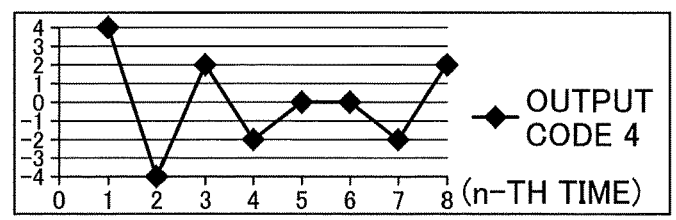
FIG. 13A is a drawing illustrating an example of a shift amount of a start position according to an embodiment of the present invention.
Figure 13B:
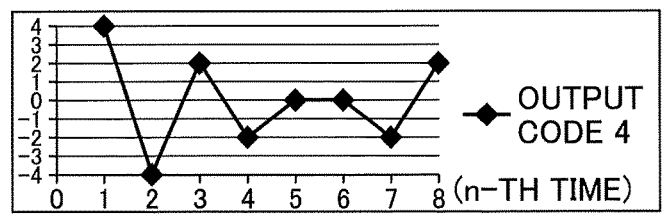
FIG. 13B is a drawing illustrating an example of a shift amount of a start position according to an embodiment of the present invention.
Figure 13C:
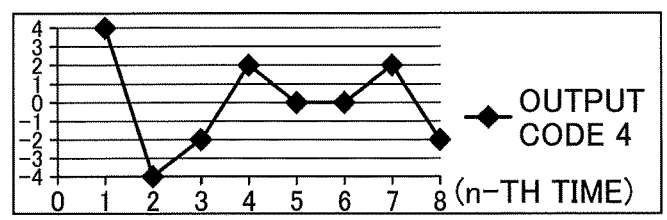
FIG. 13C is a drawing illustrating an example of a shift amount of a start position according to an embodiment of the present invention.

FIG. 13A to FIG. 13D are graphs illustrating examples of the shift amount of the start position according to an embodiment of the present invention. FIG. 13A to FIG. 13C illustrate examples of preferable shift amount combination (shift pattern) that satisfies the above-described condition.

FIG. 13A illustrates the change of the output error for FS/2 in the case where the number of the component groups 110 of the D/A converter 10 is 8, the number of shifts is 8, and the shift pattern is "4-3-4-3-4-3-4-7". This shift pattern indicates that the first shift amount is 4, the second shift amount is 3, the third shift amount is 4, the fourth shift amount is 3, the fifth shift amount is 4, the sixth shift amount is 3, the seventh shift amount is 4, and the eighth shift amount is 7.

This shift pattern "4-3-4-3-4-3-4-7" includes $2^{(i-1)}=2^{(3-1)}=4$, and includes an odd number, 3, and thus, the above-described condition is satisfied. It should be noted that, according to the above shift pattern, each of the component groups 110 is selected as the start position once in the order of "DAC1, DAC5, DAC8, DAC4, DAC7, DAC3, DAC6, DAC2". It should be noted that the last shift amount "7" is a shift amount for returning the start position to (1).

FIG. 13B indicates the change of the output error for FS/2 in the case where the shift pattern is "4-5-4-5-4-5-4-1". This shift pattern "4-5-4-5-4-5-4-1" includes $2^{(i-1)}=2^{(3-1)}=4$, and includes an odd number, 5, and thus, the above-described condition is satisfied. It should be noted that, according to the above shift pattern, each of the component groups 110 is selected as the start position once in the order of "DAC1, DAC5, DAC2, DACE, DAC3, DAC7, DAC4, DAC8". It should be noted that the last shift amount "1" is a shift amount for returning the start position to (1).

FIG. 13C indicates the change of the output error for FS/2 in the case where the shift pattern is "4-1-4-1-4-1-4-5". This shift pattern "4-1-4-1-4-1-4-5" includes $2^{(i-1)}=2"(3-1)=4$, and includes an odd number, 1, and thus, the above-described condition is satisfied. It should be noted that, according to the above shift pattern, each of the component groups 110 is selected as the start position once in the order of "(1), (5), (6), (2), (3), (7), (8), (4)". It should be noted that the last shift amount "5" is a shift amount for returning the start position to (1).

Figure 13D:
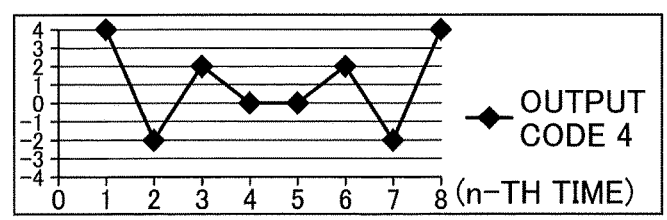
FIG. 13D is a drawing illustrating an example of a shift amount of a start position according to an embodiment of the present invention.

FIG. 13D illustrate an example of another shift amount combination that satisfies the above-described condition. This shift pattern "3-4-3-4-3-4-3-0" includes $2^{\wedge}(i-1)=2^{\wedge}(3-1)=4$, and includes an odd number, 1, and thus, the above-described condition is satisfied. However, the start positions within the component groups 110 according to the above-described shift pattern are "DAC1, DAC4, DAC8, DAC3, DAC7, DAC2, DAC1" in which DAC1 is selected twice and DAC5 is not used. Therefore, according to this shift pattern, the error reduction effects by the averaging are decreased. Therefore, it is desirable that the shift pattern is determined in such a way that, as shown in the shift amount combinations illustrated in FIG. 13A to FIG. 13C, DAC1 as the first start position is not included twice or more.

Further, it is desirable that the D/A converter 10 uses all of the "$2^{\wedge}1$" component groups 110 when outputting FS ($2^{\wedge}n-1$) because, for example, if an unnecessary component group 110 is included in the D/A converter 10, the error reduction effects will be decreased due to the fluctuations (variations) of the unused component group(s) 110.

(Summary)

A D/A converter 10 according to an embodiment of the present invention is an n-bit D/A converter ("n" is an integer equal to or greater than 2), and a plurality of DAC components included in the D/A converter 10 are divided into $2^{\wedge}i$ component groups ("i" is an integer that satisfies "$1 \leq i \leq n-1$").

Further, each of the component groups 110 includes $2^{\wedge}(n-i)$ DAC components and is connected to the output unit 130 in a predetermined order.

The D/A converter 10 includes a start position change unit 121 that changes the start position within the $2^{\wedge}i$ component groups 110 according to the predetermined order using a predefined shift pattern when generating a single analog signal corresponding to an input digital signal.

Further, the D/A converter 10 includes a component selection unit 122 that selects a number of DAC components from the start position within the $2^{\wedge}i$ component groups 110 according to the predetermined order, the number corresponding to the input digital signal.

Preferably, the predefined shift pattern used by the start position change unit 121 includes an odd-number shift amount. According to the above, it is possible to reduce an occurrence of a component group 110 that is not selected as the start position.

Preferably, the predefined shift pattern used by the start position change unit 121 includes a shift amount of $2^{\wedge}(i-1)$. According to the above, it is possible to cause the frequency of the output error for FS/2, at which the error is the largest, to be higher frequency, and it is possible to increase the error reduction effects by the LPF.

Preferably, a predetermined number of shifts, with which the start position change unit 121 shifts the start position, is $2^{\wedge}i$. According to the above, it is possible to select each of the $2^{\wedge}i$ component groups 110 as the start position, and it is possible to reduce the output signal error by averaging the output signals. It should be noted that the predetermined number of shifts, with which the start position change unit 121 shifts the start position, may be $(2^{\wedge}i)*j$ ("j" is an integer equal to or greater than 1).

According to the above, in a D/A converter 10 according to an embodiment of the present invention, the DAC components are divided into groups and the start position is changed together in the form of the component groups 110. Therefore, compared with a case of changing the start position within the DAC components, it is possible to improve the linearity of the D/A converter 10 with the number of start position changes less than the number of start position changes in the case of changing the start position within the DAC components.

In this way, according to an embodiment of the present invention, it is possible to provide a D/A converter 10 that reduces an error with DEM while reducing the number of over-samplings.

Further, in a D/A converter 10 according to an embodiment of the present invention, there are fewer number of start position change patterns, and thus, it is possible to implement the D/A converter 10 with a reduced circuit scale and a reduced area.

[Other Embodiments]

It should be noted that the structure of the D/A converter 10 described above is an example, and various applications of the D/A converter 10 according to the present invention may be possible. Next, several application examples will be described.

Application Example 1

Figure 14:
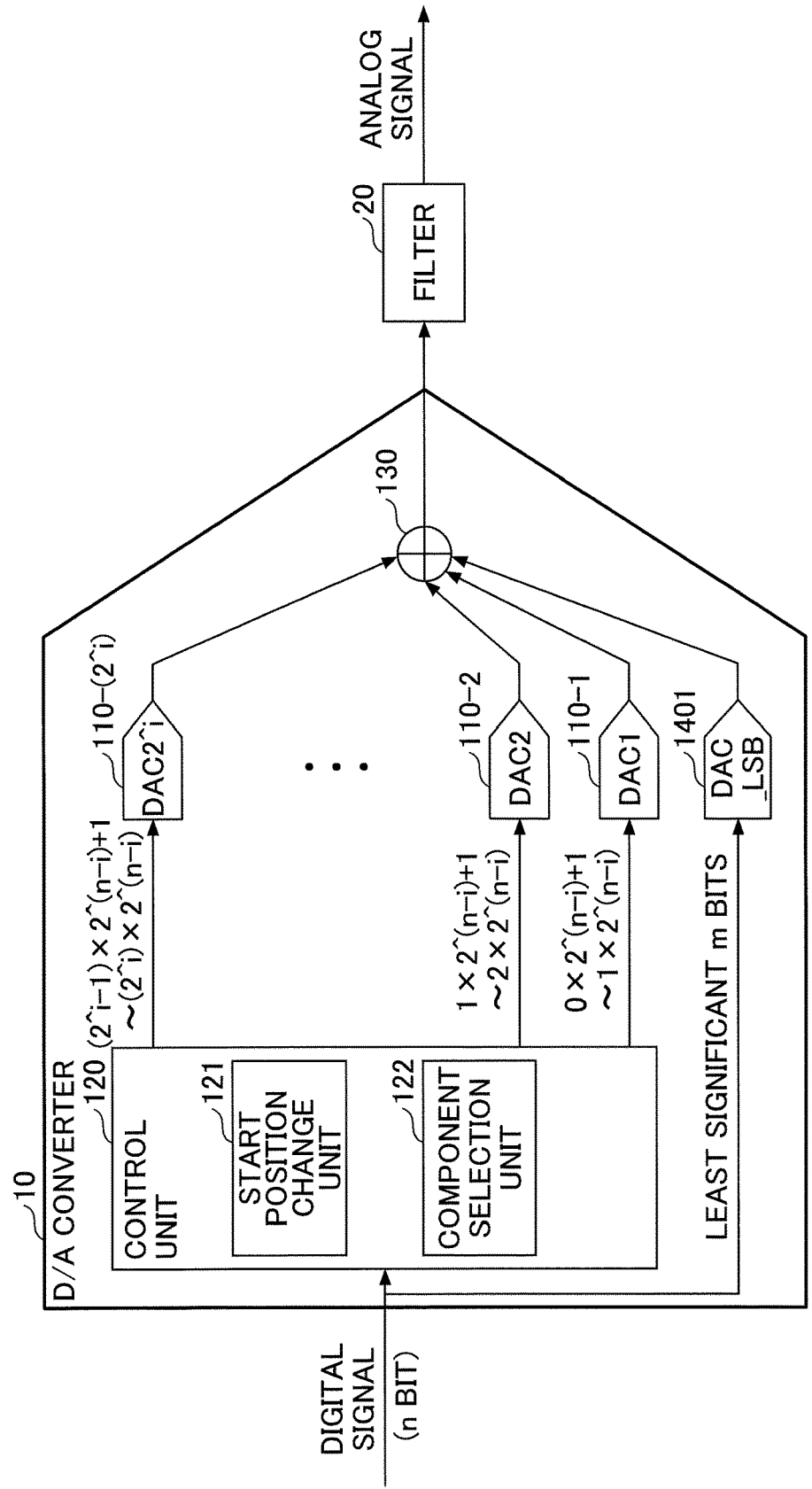
FIG. 14 is a drawing illustrating an example of a structure of a D/A converter according to an application example 1.

FIG. 14 is a drawing illustrating an example of a structure of a D/A converter according to an application example 1. The D/A converter 10 illustrated in FIG. 14 is a n-bit D/A converter, and DAC components corresponding to upper k bits ("k" is an integer that satisfies are divided into $2^{\wedge}i$ component groups 110. Structures of a control unit 120 and an output unit 130 are basically the same as in the D/A converter 10 illustrated in FIG. 1.

FIG. 15 is a block diagram illustrating an example of a D/A converter according to an application example 1. The D/A converter 10 illustrated in FIG. 15 includes the control unit 120, a component group 1401 corresponding to lower bits, an input terminal 1501, an output terminal 1502, a plurality of component groups 110-1 to 110-8 corresponding to upper bits, and an output circuit 1503.

The D/A converter 10 illustrated in FIG. 15 is a 12-bit D/A converter, and a lower 3-bit signal (DATA[2:0]), of a 12-bit digital signal (DATA[11:0]) input to the input terminal 1501, is input to the component group 1401. Further, an upper 9-bit signal (DATA[11:3]), of the 12-bit digital signal input to the input terminal 1501, is input to the control unit 120.

The control unit 120 includes a start position change unit 121 and a component selection unit 122 illustrated in FIG. 14.

When generating an analog signal corresponding to a predetermined digital signal value, the start position change unit 121 shifts the start position within the component groups 110 used for generating an analog signal by using a predetermined shift pattern for a predetermined number of times.

The component selection unit 122 selects a number of DAC components, the number corresponding to the predetermined input digital value, from the component group 110 as the above-described start position by using, for example, the thermometer coding, and connects the selected DAC components to the output circuit 1503.

The component group 1401 corresponding to the lower bits includes DAC components corresponding to the lower 3 bits. In an example in FIG. 15, a current amount corresponding to the minimum resolution of the D/A converter 10 is I/8. Here, the component group 1401 corresponding to the lower bits includes: a current source with current value I/8 corresponding to an input value 1; a current source with current value I/4 corresponding to an input value 2; and a current source with current value I/2 corresponding to an input value 3.

Each of the plurality of component groups 110-1 to 110-8 corresponding to the upper bits includes 64 current sources with a current value I.

One of the terminals of each of the current sources included in the component group 1401 and the plurality of component groups 110-1 to 110-8 is connected to a power supply, and the other of the terminals is connected to the output circuit 1503 via a switch.

The output circuit 1503 generates an output voltage according to a current supplied from the plurality of DAC components (current sources) selected by the control unit 120.

In this way, by dividing the bits into the lower bits (for which the weight of the DAC components is low) and the upper bits, and by applying the structure illustrated in FIG. 1 to FIG. 13D to only the upper bits (whose impact on the output signal error is large), it is possible to reduce the circuit scale, cost, etc.

Figure 16:
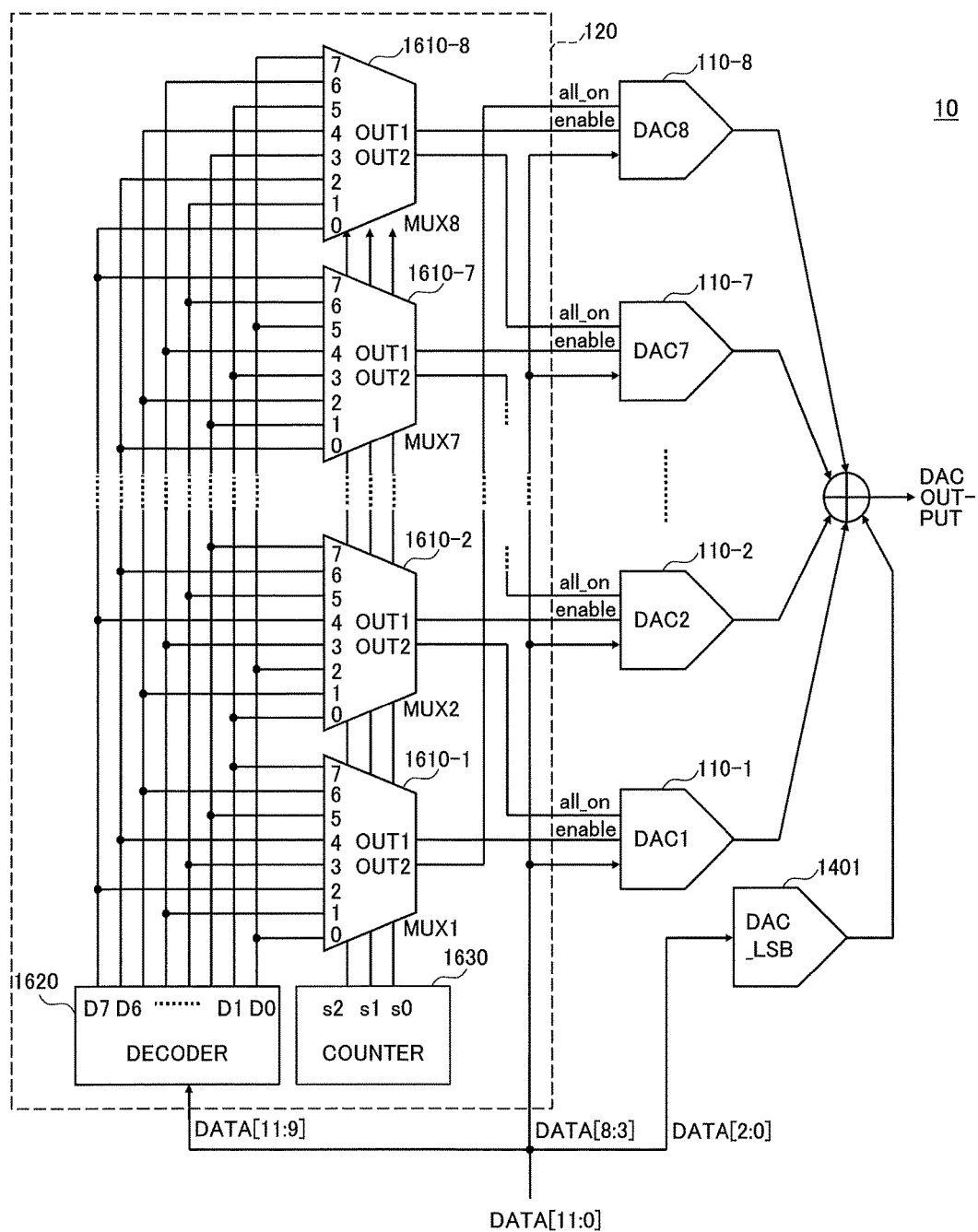
FIG. 16 is a drawing illustrating an example of a circuit structure of a D/A converter according to an application example 1.

FIG. 16 is a drawing illustrating an example of a circuit structure of a D/A converter according to an application example 1. In FIG. 16, the lower 3-bit signal (DATA[2:0]) of the 12-bit digital signal input to the D/A converter 10 (DATA[11:0]) is input to the component group 1401 including the DAC components corresponding to the lower 3 bits. Further, the upper 9-bit signal (DATA[11:3]) of the 12-bit digital signal input to the D/A converter 10 is input to, for example, the control unit 120.

The control unit 120 includes a plurality of multiplexers 1610-1 to 1610-8 corresponding to the plurality of component groups 110-1 to 110-8, a decoder 1620, and a counter 1630. It should be noted that, in the following descriptions, a term "multiplexer 1610" is used for indicating an arbitrary multiplexer among the plurality of multiplexers 1610-1 to 1610-8. Further, the multiplexers 1610-1 to 1610-8 may be referred to as MUX1 to MUX8, respectively.

An upper 3-bit signal (DATA[11:9]) of the 9-bit signal (DATA[11:3]) input to the control unit 120 is input to the decoder 1620. The decoder 1620 decodes the input 3-bit signal (DATA[11:9]) and outputs, for example, an 8-bit output signal (D0 to D7) illustrated in FIG. 17A. In an example in FIG. 17A, the decoder 1620 increases the value of the output signal of the decoder 1620 according to the increase of the input 3-bit signal (DATA[11:9]) based on the thermometer coding.

Further, a lower 6-bit signal (DATA[8:3]) of the 9-bit signal (DATA[11:3]) input to the control unit 120 is input to each of the plurality of the component groups 110-1 to 110-8 as illustrated in FIG. 16.

The counter 1630 outputs "counter output signal" s0, s1, s2 by incrementing it according to the output (update) of the D/A converter 10. The value of the output signal of the counter 1630 (s0, s1, s2) is incremented by the counter 1630 by 1 according to the first output to the eighth output. After the eighth output, the value returns to the first output, and the same operations are repeated.

The output signal of the counter 1630 (s0-s2) and the output signal of the decoder 1620 (D0-D7) are input to the multiplexer 1610. The multiplexer 1610 outputs output signals OUT1 and OUT2 as illustrated in FIG. 17B according to the output signal of the counter 1630 (s0-s2) and the output signal of the decoder (D0-D7).

The output signal OUT1 of the multiplexer 1610 is an output of an ordinary multiplexer. For example, in FIG. 17B, in the case where the D/A converter 10 performs the first output, the MUX1 outputs an output signal D0 of the decoder 1620. Further, the MUX2 outputs an output signal D1, the MUX3 outputs an output signal D2, the MUX4 outputs an output signal D3, the MUX5 outputs an output signal D4, the MUX6 outputs an output signal D5, the MUX7 outputs an output signal D6, and the MUX8 outputs an output signal D7.

Further, in FIG. 17B, in the case where the D/A converter 10 performs the second output, the MUX5 outputs an output signal D0 of the decoder 1620. Further, the MUX6 outputs an output signal D1, the MUX7 outputs an output signal D2, the MUX8 outputs an output signal D3, the MUX1 outputs an output signal D4, the MUX2 outputs an output signal D5, the MUX3 outputs an output signal D6, and the MUX4 outputs an output signal D7.

In this way, the output signals OUT1 and OUT2 of the multiplexers 1610-1 to 1610-8 are changed by the output signal of the counter 1630. According to the above, the start position within the plurality of the component groups 110-1 to 110-8 is changed.

In an example in FIG. 17B, from the first output to the eighth output of the D/A converter 10, the start position within the plurality of the component groups 110-1 to 110-8 is changed according to a predetermined shift pattern "4-3-4-3-4-3-4-7".

Further, the output signals OUT1 of the multiplexers 1610-1, 1610-2, . . . are input to the plurality of the component groups 110-1, 110-2, . . . , respectively, as "enable" signals as illustrated in FIG. 16.

The output signal OUT2 of the multiplexer 1610 is the same as the output signal OUT1 except for D0 being replaced by a fixed "0". Further, the output signals OUT2 of the multiplexers 1610-1, 1610-2, . . . are input to the plurality of the component groups 110-8, 110-1, 110-2, . . . , respectively, as "all_on" signals, the correspondence between the multiplexers and the component groups being shifted by 1 as illustrated in FIG. 16.

With respect to the above, the "enable" signal and the "all_on" signal input to each of the component groups 110 are rearranged in the order of the output times of the D/A converter 10 as illustrated in a table in FIG. 18A.

In FIG. 18A, in the case where the "enable" signal and the "all_on" signal are "0", as illustrated in FIG. 18B, each of the component groups 110 outputs "ALL 0" as an output signal in which all of the components output "0".

Further, in the case where the "enable" signal is "1" and the "all_on" signal is "0", as illustrated in FIG. 18B, each of the component groups 110 outputs a value corresponding to the input digital signal (DATA[8:3]) as an output signal.

Furthermore, in the case where the "enable" signal and the "all_on" signal are "1", as illustrated in FIG. 18B, each of the component groups 110 outputs "ALL 1" as an output signal in which all of the components output "1".

According to the above operations, it is possible for the D/A converter 10 to change (shift) the start position within the plurality of the component groups 110-1 to 110-8 used for generating an analog signal according to a predetermined shift pattern "4-3-4-3-4-3-4-7".

It should be noted that the start position change unit 121 of the D/A converter 10 is realized by, for example, the counter 1630, etc., in FIG. 16. Further, the component selection unit 122 of the D/A converter 10 is realized by, for example, the decoder 1620, the plurality of the multiplexers 1610-1 to 1610-8, etc., in FIG. 16.

Figure 19:
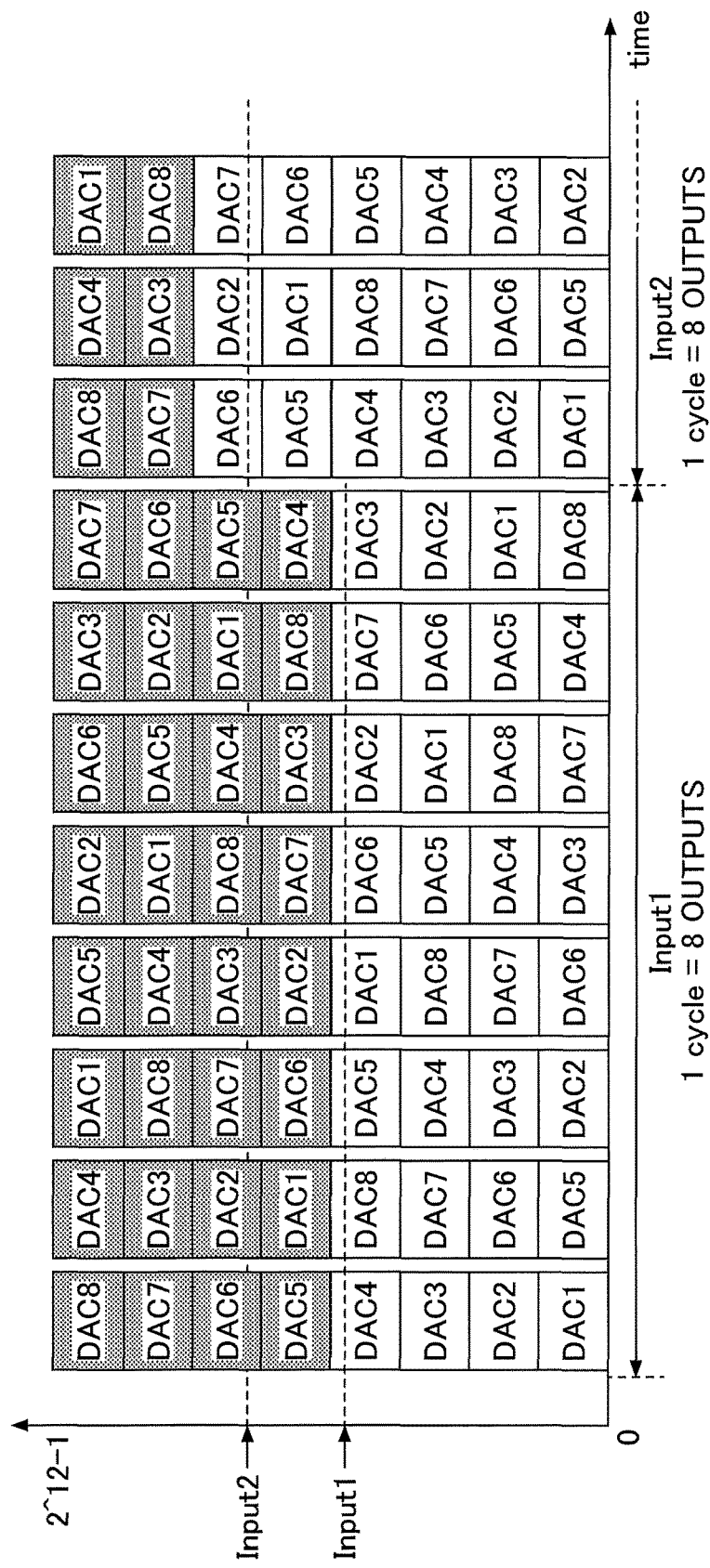
FIG. 19 is an operation image diagram of a D/A converter according to an application example 1.

FIG. 19 is a drawing illustrating an operation example of a D/A converter according to an application example 1.

Specifically, FIG. 19 is an operation image diagram of a D/A converter 10 illustrated in FIG. 14 and FIG. 16.

For example, when a digital value "Input1" is input to the input terminal 1501 of the D/A converter 10, the D/A converter 10 outputs analog signals corresponding to the "Input1" for, for example, eight times.

Here, for example, the digital value "Input1" as an input signal may be input from the outside of the D/A converter 10 for eight times, or, output signals corresponding to the one digital value may be automatically generated in the D/A converter 10 for eight times.

In an example of FIG. 19, with respect to the first output signal corresponding to the "Input1", the DAC1 (component group 110-1) is the start position. Here, "1" for "enable" signals and "1" for "all_on" signals are input to the DAC1 to the DAC3 (component groups 110-1 to 110-3), and the DAC1 to the DAC3 output "ALL 1". Further, the DAC4 (component group 110-4) outputs a signal by using a number of DAC components, the number being corresponding to bit 3 to bit 8 of the "Input1" (DATA[8:3]). Further, "0" for "enable" signals and "0" for "all_on" signals are input to the DAC5 to the DAC8 (component groups 110-5 to 110-8), and the DAC5 to the DAC8 output "ALL 0".

With respect to the second output to the eight output corresponding to the "Input1", the similar operations are performed by changing (shifting) the start position according to a predetermined shift pattern "4-3-4-3-4-3-4-7".

Referring to FIG. 19, it can be seen that each of the DAC1 to the DAC8 becomes (takes) the start position once and each of the DAC1 to the DAC8 outputs signals for four times.

Therefore, by averaging the eight output signals by using, for example, the LPF illustrated in FIG. 12A and FIG. 12B, the errors of component groups 110 are averaged and the error of the output signal is reduced.

Similarly, when the next digital value "Input2" is input, the D/A converter 10 outputs output signals corresponding to the digital value "Input2" for eight times by shifting the start position within the DAC1 to the DAC8.

Application Example 2

Figure 20:
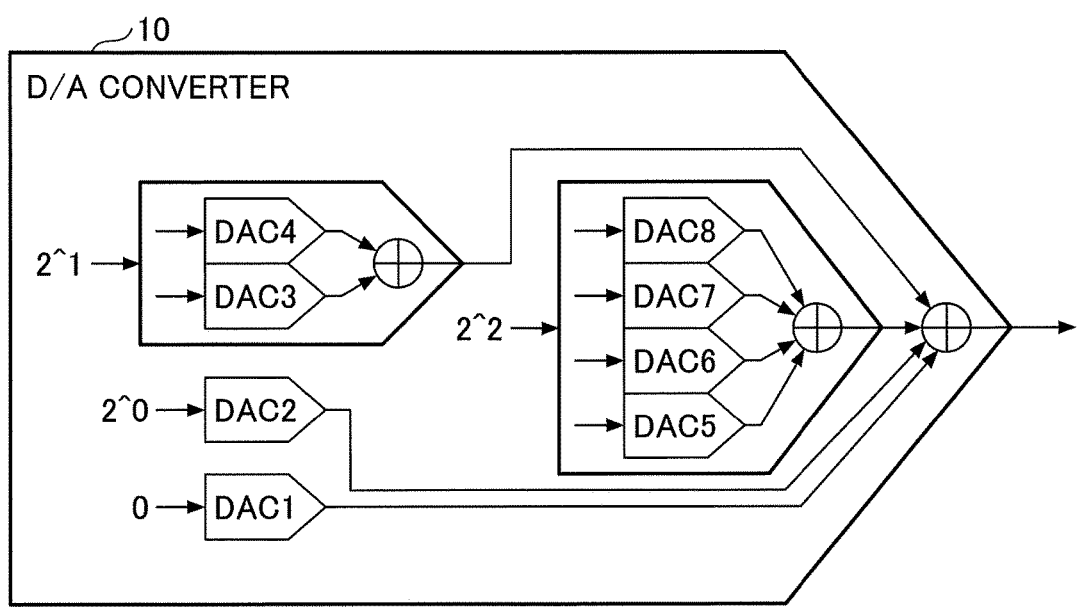
FIG. 20 is a drawing illustrating an example of a structure of a D/A converter according to an application example 2.

FIG. 20 is a drawing illustrating an example of a structure of a D/A converter according to an application example 2. In the embodiments described above, the component selection unit 122 of the D/A converter 10 selects a number of the DAC components by using the thermometer coding, the number corresponding to the input digital value. It should be noted that the method of selecting the DAC components by using the thermometer coding is a preferable example. The component selection unit 122 may select the DAC components based on the binary coding, without using the thermometer coding.

In this case, the plurality of the DAC components of the D/A converter 10 are divided in such a way that the divided groups directly correspond to the binary coding, 0, 2^0, 2^1, 2^2, . . . , and the component selection unit 122 selects the DAC components corresponding to the input binary code.

Figure 21:
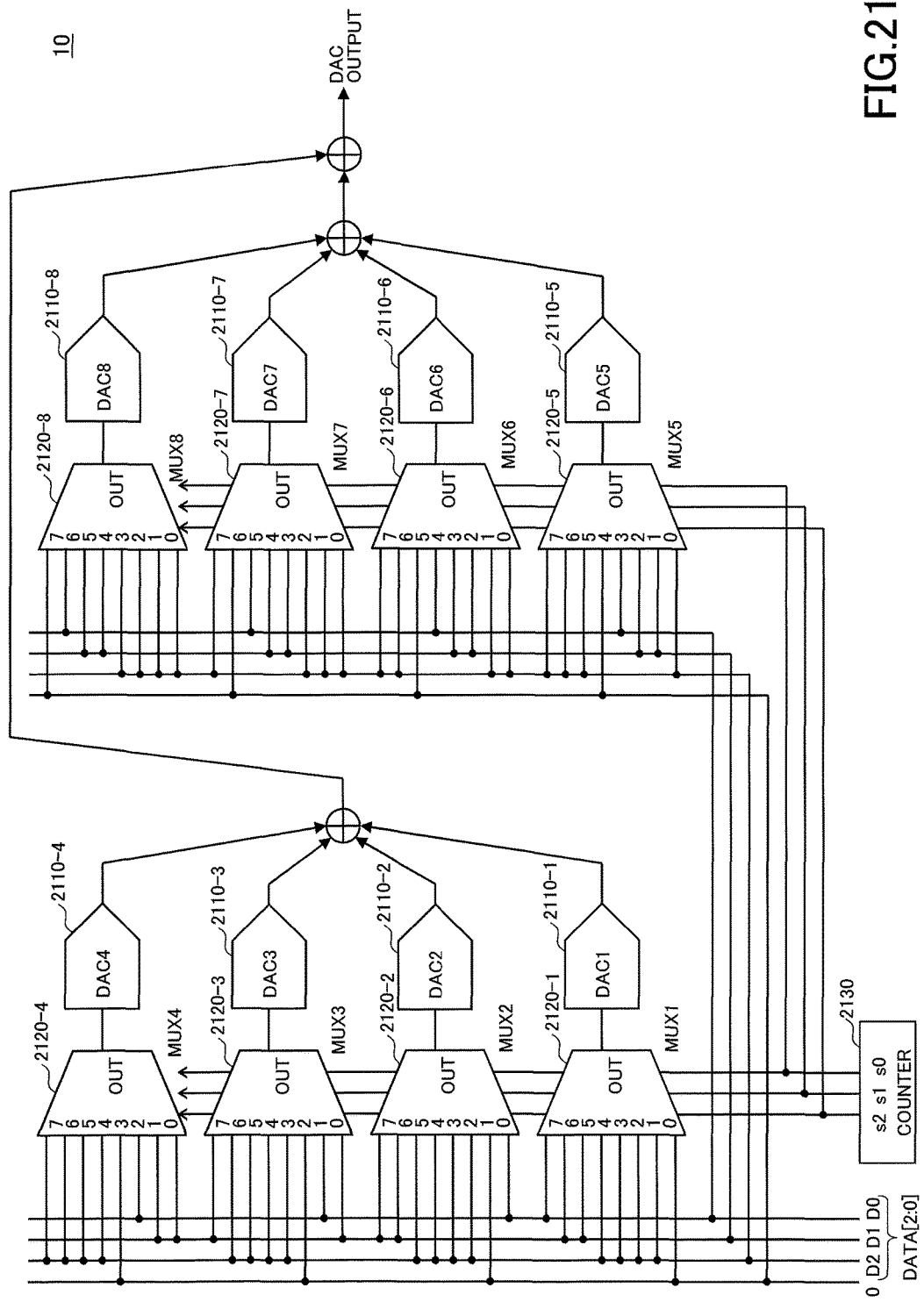
FIG. 21 is a drawing illustrating an example of a circuit structure of a D/A converter according to an application example 2.

FIG. 21 is a drawing illustrating an example of a circuit structure of a D/A converter according to an application example 2. In FIG. 21, the D/A converter 10 includes a plurality of DAC components 2110-1 to 2110-8, a plurality of multiplexers 2120-1 to 2120-8, and a counter 2130. It should be noted that, in the following descriptions, a term "DAC component 2110" is used for indicating an arbitrary DAC component among the plurality of DAC components 2110-1 to 2110-8. Further, a term "multiplexer 2120" is used for indicating an arbitrary multiplexer among the plurality of multiplexers 2120-1 to 2120-8.

Similar to the counter 1630 illustrated in FIG. 16, the counter 2130 outputs output signals s0, s1, s2 by incrementing the value of s0, s1, s2 by 1 from the first output to the eight output according to the outputs (updates) of the D/A converter 10. Further, after completing the eighth output, the counter 2130 returns to the first output and repeats the similar operations.

A 3-bit digital signal (DATA[2:0]) and "0" are input to each of the plurality of the multiplexers 2120-1 to 2120-8 as illustrated in FIG. 21. For example, a signal D0 is connected to one of the inputs of each of the plurality of the multiplexers 2120-1 to 2120-8 by shifting the input position by 1. Further, a signal D1 is connected to two of the inputs of each of the plurality of the multiplexers 2120-1 to 2120-8 by shifting the input position by 1. Similarly, a signal D2 is connected to four of the inputs of each of the plurality of the multiplexers 2120-1 to 2120-8 by shifting the input position by 1.

In the D/A converter 10 illustrated in FIG. 21, signals illustrated in FIG. 22 are input to the plurality of the DAC components 2110-1 to 2110-8 according to the value of the output signal s0-s3 of the counter 213.

For example, in FIG. 22, in the case where the D/A converter 10 performs the first output, data D0 is input to the DAC2 (DAC component 2110-2), and data D1 is input to the DAC3 and the DAC4 (DAC components 2110-3, 2110-4). Further, data D2 is input to the DAC5 to the DAC8 (DAC components 2110-5 to 2110-8).

Figure 23A:
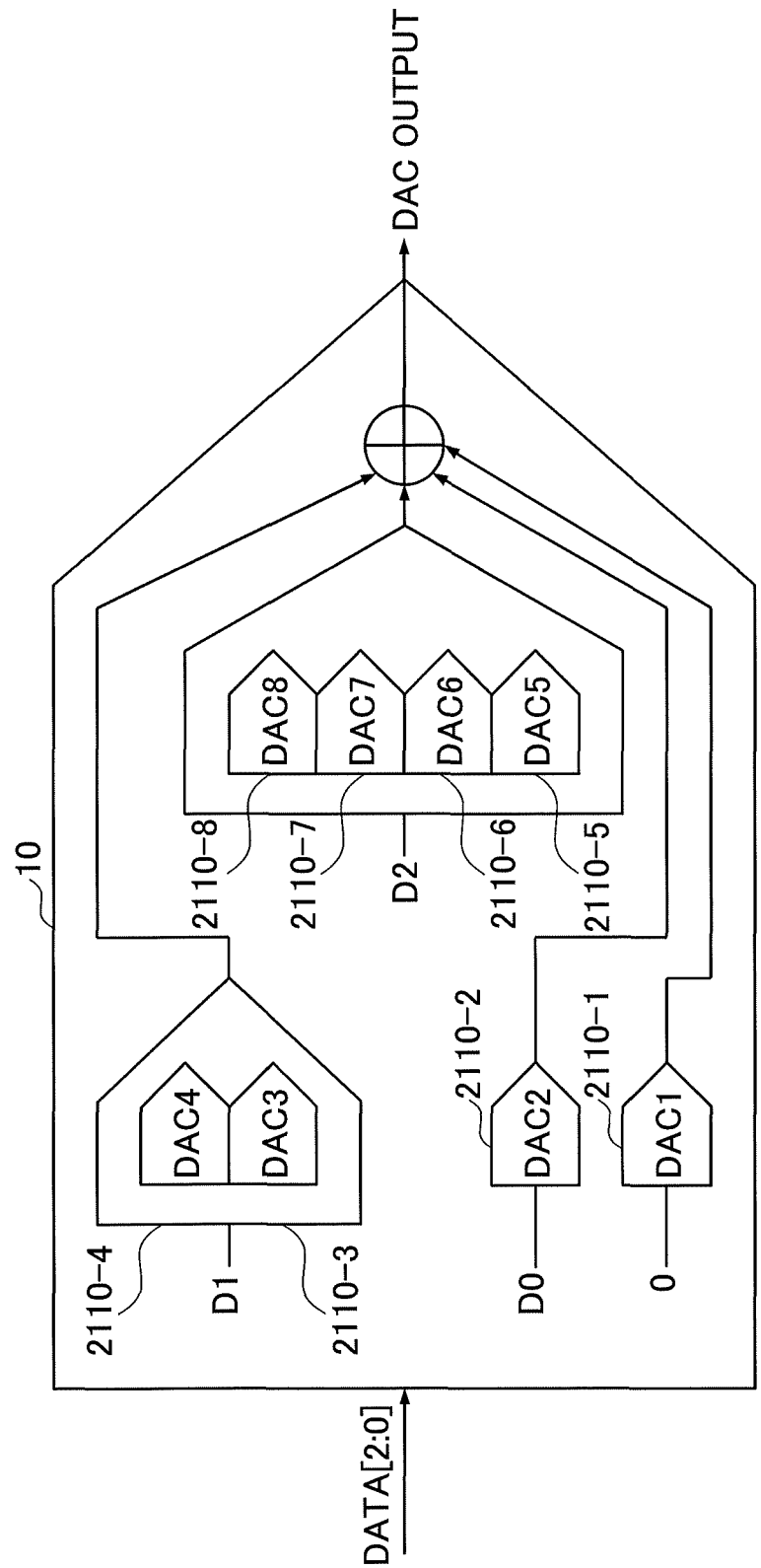
FIG. 23A is an operation image diagram of a D/A converter according to an application example 2.

FIG. 23A is an image diagram of each of the components 2110 of the D/A converter 10. In an example of FIG. 23A, the start position within the plurality of the DAC components 2110-1 to 2110-8 is the DAC2 (DAC component 2110-2) to which the data D0 is input.

Further, in FIG. 22, in the case where the D/A converter 10 performs the third output, data D0 is input to the DAC5, and data D1 is input to the DAC5 and the DAC6. Further, data D2 is input to the DAC6, the DAC8, the DAC1, and the DAC2.

Figure 23B:
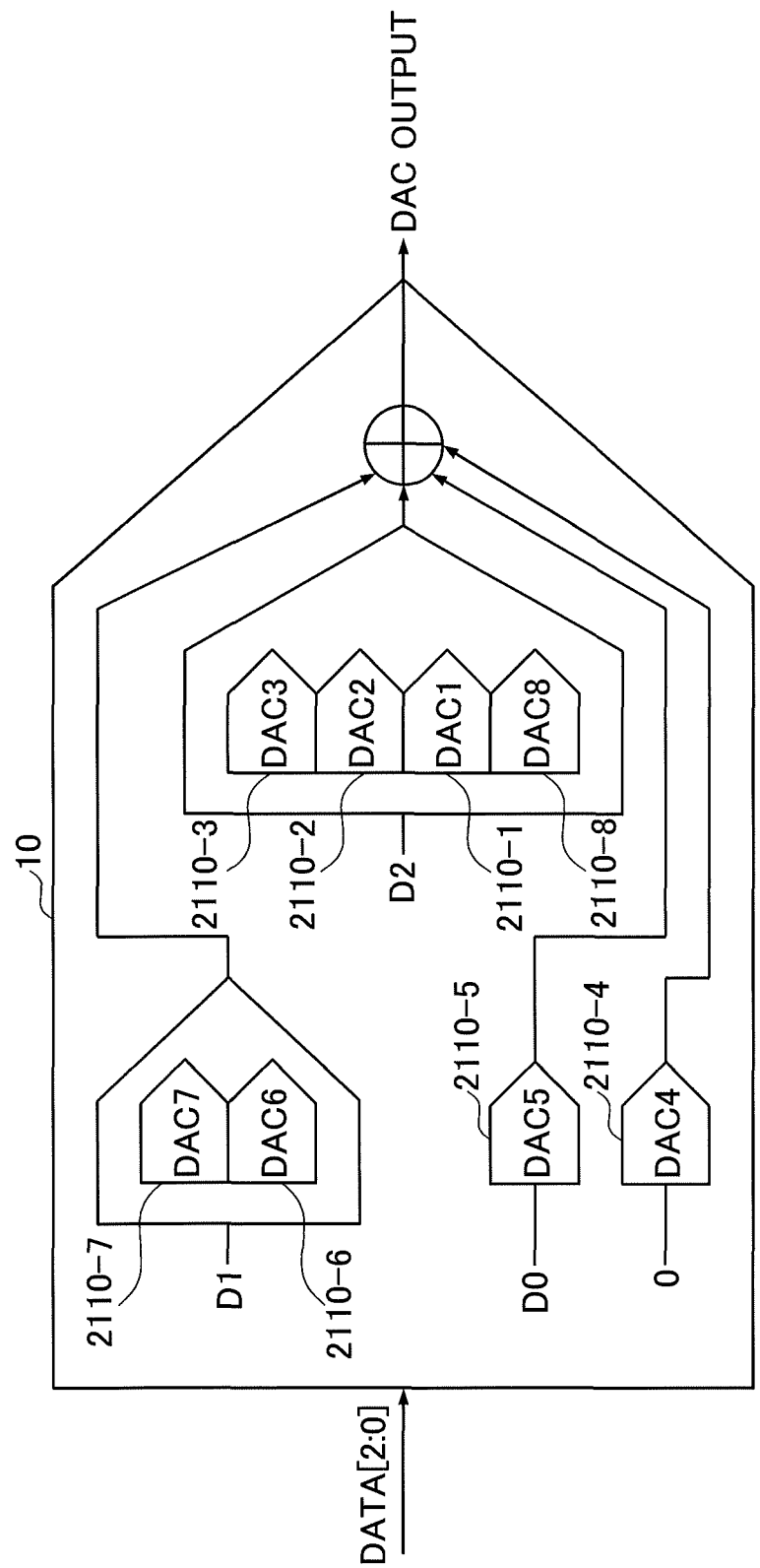
FIG. 23B is an operation image diagram of a D/A converter according to an application example 2.

FIG. 23B is an image diagram of each of the components 2110 of the D/A converter 10. In an example of FIG. 23B, the start position within the plurality of the DAC components 2110-1 to 2110-8 is the DAC5 (DAC component 2110-5) to which the data D0 is input.

It is possible for the D/A converter 10 to select the DAC components 2110 according to the binary coding, without using the thermometer coding, by dividing the DAC components 2110 into a plurality of component groups corresponding to the bit weights of the binary code.

Further, also in this case, it is possible to shift the start position within the plurality of the component groups corresponding to the bit weights of the binary code (that is, the position of the DAC component 2110 to which the data D0 is output) by using a predetermined shift pattern.

It should be noted that the DAC component 2110 to which the data D0 is output is an example of a component group including one or more DAC components.

Further, in an example illustrated in FIG. 21 and FIG. 22, for the sake of description convenience, the start position within the plurality of the component groups is shifted by 1 (group). In an example illustrated in FIG. 21 and FIG. 22, it is also desirable that the start position within the plurality of the component groups is changed by using a predefined shift pattern.

Application Example 3

Figure 24:
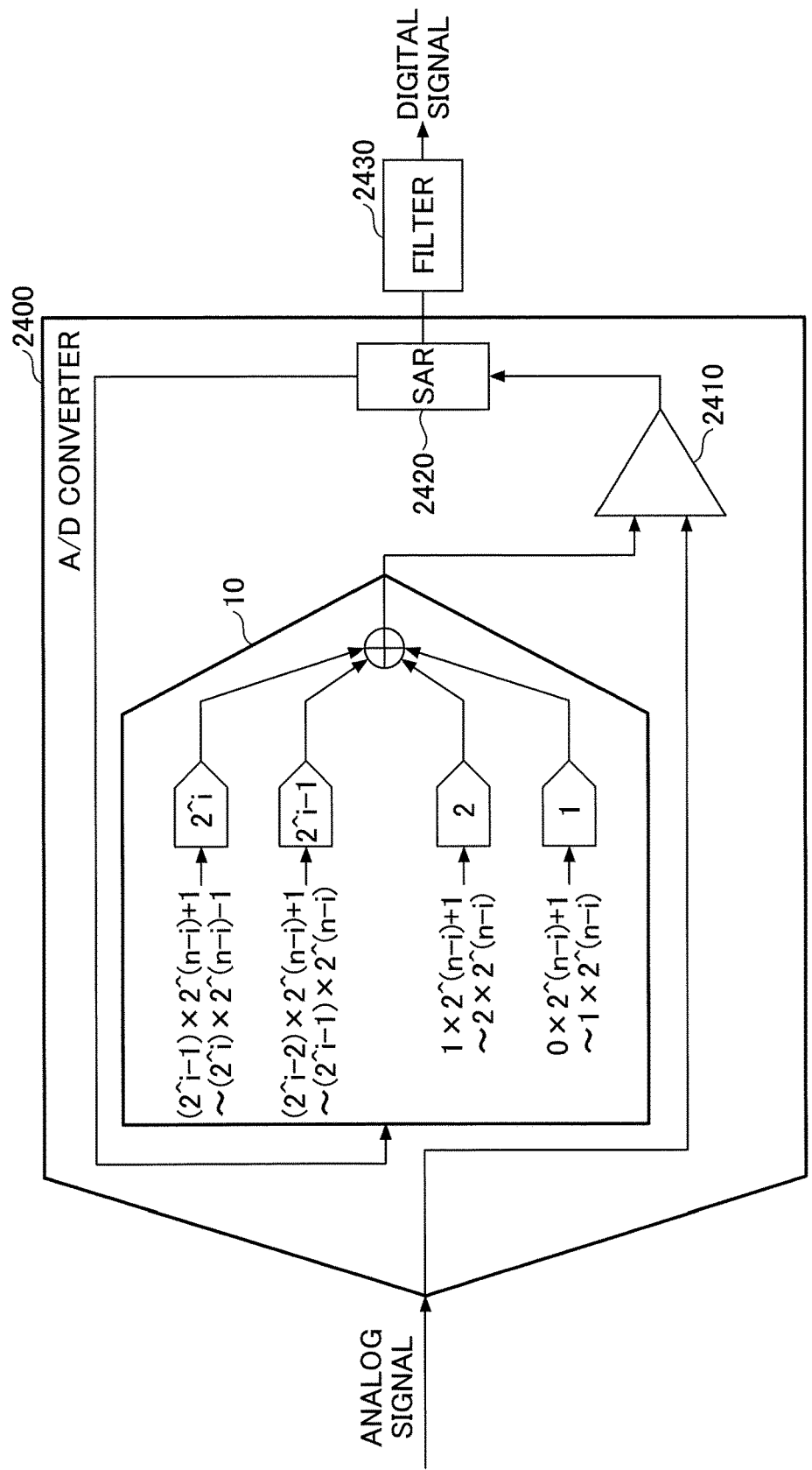
FIG. 24 is a drawing illustrating an example of a structure of an A/D converter according to an application example 3.

FIG. 24 is a drawing illustrating an example of a structure of an A/D converter according to an application example 2.

An A/D converter 2400 illustrated in FIG. 24 is a successive approximation type A/D (Analog to Digital) converter, and includes, for example, a D/A converter 10 illustrated in FIG. 1, a comparator 2410, and a successive approximation type register (SAR) 2420, etc.

In FIG. 24, the comparator 2410 compares a voltage of the input signal (analog signal) with an output voltage of the D/A converter 10.

The SAR 2420 changes the input data of the D/A converter 10 based on the comparison result of the comparator 2410, and repeats the similar change until there is no difference between the voltage of the input signal and the output voltage of the D/A converter 10. In this way, it is possible for the SAR 2420 to identify a digital value corresponding to the voltage of the input signal. The SAR 2420 performs this process, for example, for each bit in the order from the upper most bit. In an n-bit A/D converter, the SAR 2420 performs the A/D conversion process in which the output digital value is determined by n-times processes.

The filter 2430 in FIG. 24 is a digital filter for averaging results of the A/D conversion processing by the SAR 2420. The filter 2430 may be provided outside the A/D converter 2400, or may be provided inside the A/D converter 2400.

Figure 25:
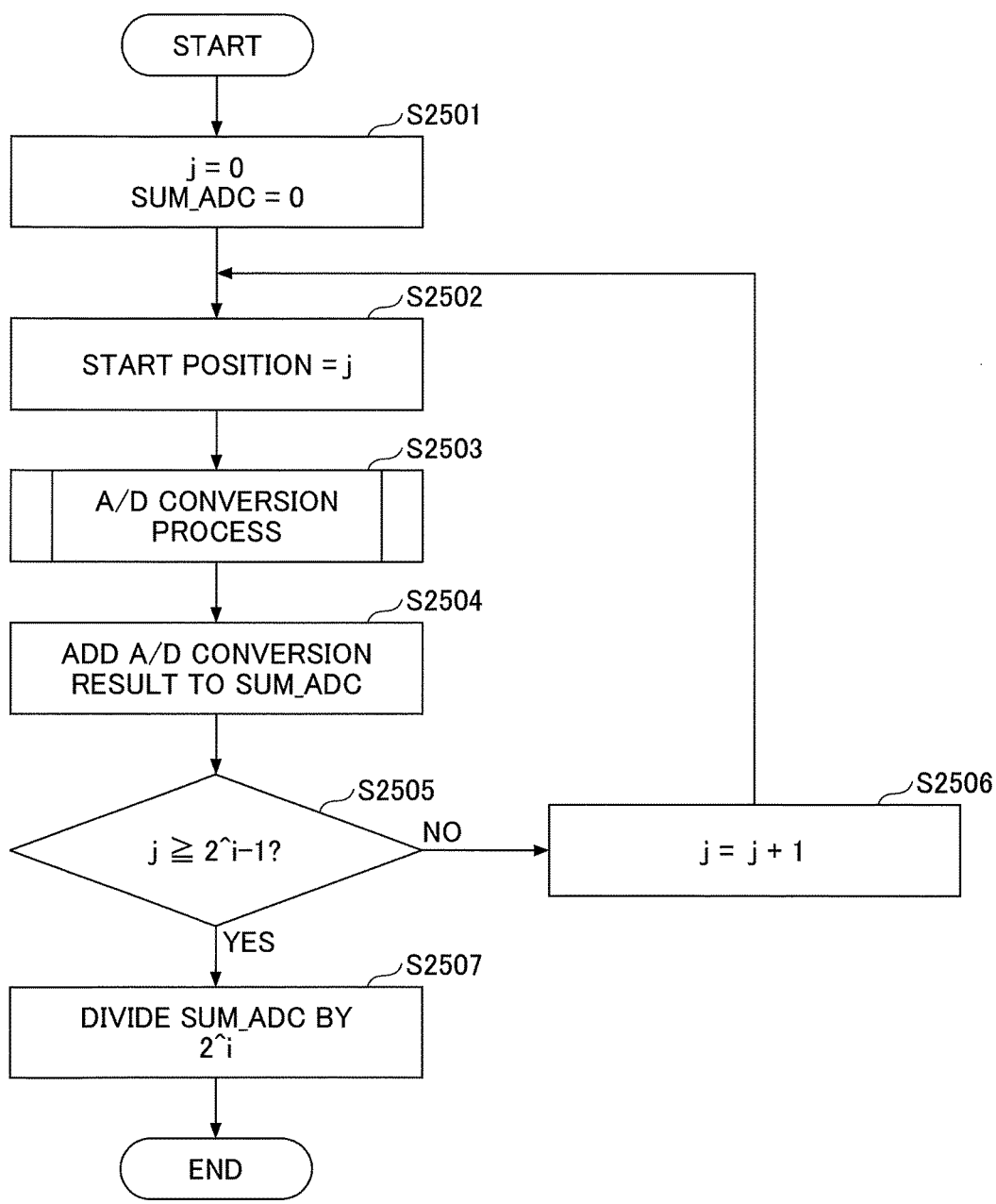
FIG. 25 is a flowchart illustrating an example of a process of an A/D converter according to an application example 3.

FIG. 25 is a flowchart illustrating an example of a process of an A/D converter according to an application example 3. In an example of FIG. 25, the A/D converter 2400 changes the start position within the plurality of component groups of the D/A converter 10 every time the A/D conversion process is performed.

In step S2501, the A/D converter 2400 initializes a variable "j" used for counting the number of performed A/D conversion processes and a variable "SUM_ADC" used for storing the sum of the results of the A/D conversion processes.

In step S2502, the start position within the plurality of the component groups 110-1 to 110-8 is changed by the counter 1630 of the D/A converter 10 illustrated in FIG. 16 by outputting "j" as the value of the counter output signal (s0, s1, s2).

In step S2503, the SAR 2420 of the A/D converter 2400 performs the above-described A/D conversion process.

In step S2504, the SAR 2420 of the A/D converter 2400 adds the result of the A/D conversion obtained by the A/D conversion process to the "SUM_ADC".

In step S2505, the A/D converter 2400 determines whether the A/D conversion processes have been performed for a predetermined number of times by determining whether "j" is equal to or greater than "$2^i-1$".

In the case where the A/D conversion processes have not been performed for the predetermined number of times ($2^i$ times) (NO in step S2505), the A/D converter 2400 adds 1 to "j", and returns to step S2502.

On the other hand, in the case where the A/D conversion processes have been performed for the predetermined number of times ($2^i$ times) (YES in step S2505), the A/D converter 2400 proceeds to step S2507.

In step S2507, an A/D conversion result is calculated by the SAR 2420 of the A/D converter 2400 or by the filter 2430, by performing averaging by dividing "SUM_ADC" by the number of A/D conversion processing times "$2^i$".

According to the above operations, it is possible for the A/D converter 2400 to obtain an A/D conversion result with high accuracy by using the D/A converter 10.

In this way, it is possible to increase the conversion accuracy of the A/D converter 2400 by using, for example, the D/A converter 10 illustrated in FIG. 1 as a D/A converter included in the A/D converter 2400.

A D/A converter and an A/D converter have been described above according to one or more embodiments of the present invention. All of the examples and limiting expressions in the present specification are intended to help readers to understand the concept of the present invention, are not intended to be interpreted as limiting the present invention, and are not related to the superiority or the inferiority of the present invention. It should be understood that various changes, replacements, and modifications may be available without departing from the scope of the present invention.

The present application is based on and claims the benefit of priority of Japanese Priority Application No. 2016-040764 filed on Mar. 3, 2016, the entire contents of which are hereby incorporated herein by reference.

DESCRIPTION OF THE REFERENCE NUMERALS

10 D/A converter
20 filter (averaging unit)
110 component group
121 start position change unit
122 component selection unit (selection unit)
130 output unit
1503 output circuit (an example of an output unit)
2400 A/D converter

What is claimed is:

1. A D/A converter for converting a digital signal with a predetermined number of bits to an analog signal, the D/A converter comprising:
a plurality of component groups that include a plurality of components included in the D/A converter and are connected to an output unit for outputting the analog signal in a predetermined order; and
a start position change unit that changes a start position within the plurality of the component groups used for generating a single analog signal by using a predefined shift pattern when generating the single analog signal corresponding to the digital signal, wherein
the digital signal is a digital signal with n bits (n is an integer equal to or greater than 2), and
the plurality of the component groups are configured by dividing the plurality of the components corresponding to upper k bits of the n bits (k is an integer that satisfies: $2 \le k \le n$) into $2^i$ groups (i is an integer that satisfies: $1 \le i \le n-1$).

2. The D/A converter according to claim 1, wherein when outputting data of $2^n-1$, as many as $2^i$ of the component groups are used.

3. The D/A converter according to claim 1, wherein in the case where it is assumed that a weight of a minimum resolution of the D/A converter is 1, the weight of each of the plurality of the component groups is $2^{(n-i)}$.

4. The D/A converter according to claim 1, further comprising:
a selection unit that, starting from one of the component groups as the start position according to the predetermined order, selects a number of the components, the number corresponding to a value of the digital signal.

5. The D/A converter according to claim 1, further comprising:
a selection unit that selects the components corresponding to a binary value of the digital signal with the plurality of the component groups being weighted according to binary coding and the predetermined order starting from one of the component groups as the start position.

6. The D/A converter according to claim 1, wherein
the single analog signal is generated by averaging a plurality of analog signals obtained by having the start position shifted by the start position change unit.

7. The D/A converter according to claim 1, wherein
the start position change unit shifts the start position within the plurality of the component groups used for generating the single analog signal for $(2^{\wedge}i)*j$ times (j is an integer equal to or greater than 1) according to the predetermined order by using the predefined shift pattern.

8. An A/D converter that includes the D/A converter according to claim 1.

9. A D/A converter for converting a digital signal with a predetermined number of bits to an analog signal, the D/A converter comprising:
a plurality of component groups that include a plurality of components included in the D/A converter and are connected to an output unit for outputting the analog signal in a predetermined order; and
a start position change unit that changes a start position within the plurality of the component groups used for generating a single analog signal by using a predefined shift pattern when generating the single analog signal corresponding to the digital signal, wherein
the predefined shift pattern includes two or more different shift amounts.

10. The D/A converter according to claim 9, wherein
the two or more different shift amounts include a shift amount of an odd number.

11. The D/A converter according to claim 9, wherein
the two or more different shift amounts include a shift amount of $2^{\wedge}(i-1)$.

12. The D/A converter according to claim 9, further comprising:
a selection unit that, starting from one of the component groups as the start position according to the predetermined order, selects a number of the components, the number corresponding to a value of the digital signal.

13. The D/A converter according to claim 9, further comprising:
a selection unit that selects the components corresponding to a binary value of the digital signal with the plurality of the component groups being weighted according to binary coding and the predetermined order starting from one of the component groups as the start position.

14. The D/A converter according to claim 9, wherein
the single analog signal is generated by averaging a plurality of analog signals obtained by having the start position shifted by the start position change unit.

15. The D/A converter according to claim 9, wherein
the start position change unit shifts the start position within the plurality of the component groups used for generating the single analog signal for $(2^{\wedge}i)*j$ times (j is an integer equal to or greater than 1) according to the predetermined order by using the predefined shift pattern.

16. An A/D converter that includes the D/A converter according to claim 9.

* * * * *